US012667001B2

(12) United States Patent
Yang et al.

(10) Patent No.: US 12,667,001 B2
(45) Date of Patent: Jun. 23, 2026

(54) INTEGRATED PACKAGING ARCHITECTURE WITH SOLDER AND NON-SOLDER INTERCONNECTS

(71) Applicant: Intel Corporation, Santa Clara, CA (US)

(72) Inventors: Jin Yang, Hillsboro, OR (US); David Shia, Portland, OR (US); Adel A. Elsherbini, Tempe, AZ (US); Christopher M. Pelto, Beaverton, OR (US); Kimin Jun, Portland, OR (US); Bradley A. Jackson, Lake Oswego, OR (US); Robert J. Munoz, Round Rock, TX (US); Shawna M. Liff, Scottsdale, AZ (US); Johanna M. Swan, Scottsdale, AZ (US)

(73) Assignee: Intel Corporation, Santa Clara, CA (US)

( * ) Notice: Subject to any disclaimer, the term of this patent is extended or adjusted under 35 U.S.C. 154(b) by 429 days.

(21) Appl. No.: 17/538,603

(22) Filed: Nov. 30, 2021

(65) Prior Publication Data

US 2023/0170327 A1　　Jun. 1, 2023

(51) Int. Cl.
| | |
|---|---|
| *H10W 90/00* | (2026.01) |
| *H10W 72/00* | (2026.01) |
| *H10W 72/20* | (2026.01) |
| *H10W 74/15* | (2026.01) |

(52) U.S. Cl.
CPC ...... *H10W 90/00* (2026.01); *H10W 72/07232* (2026.01); *H10W 72/07236* (2026.01); *H10W 72/07254* (2026.01); *H10W 72/247* (2026.01); *H10W 74/15* (2026.01); *H10W 90/722* (2026.01); *H10W 90/724* (2026.01); *H10W 90/732* (2026.01); *H10W 90/792* (2026.01)

(58) Field of Classification Search
CPC .. H01L 25/0657; H01L 25/0652; H01L 25/50
See application file for complete search history.

(56) References Cited

U.S. PATENT DOCUMENTS

2014/0203457 A1* 7/2014 Kim .................... H01L 25/0657
257/778
2019/0385977 A1* 12/2019 Elsherbini .............. H01L 24/14

* cited by examiner

*Primary Examiner* — Errol V Fernandes
(74) *Attorney, Agent, or Firm* — Akona IP PC

(57) ABSTRACT

A microelectronic assembly is provided, comprising: a first IC die coupled to a surface with first interconnects having a first pitch; and a second IC die coupled to the surface with second interconnects having a second pitch. The second pitch is greater than the first pitch, and the first pitch is less than 10 micrometers. In another embodiment, a microelectronic assembly is provided, comprising: a first stack coupled to a surface, the first stack comprising a first number of IC dies; and a second stack coupled to the surface, the second stack comprising a second number of IC dies, in which: the first stack and the second stack are laterally surrounded by a dielectric, the first stack and the second stack have a same thickness, and the first number is less than the second number.

14 Claims, 11 Drawing Sheets

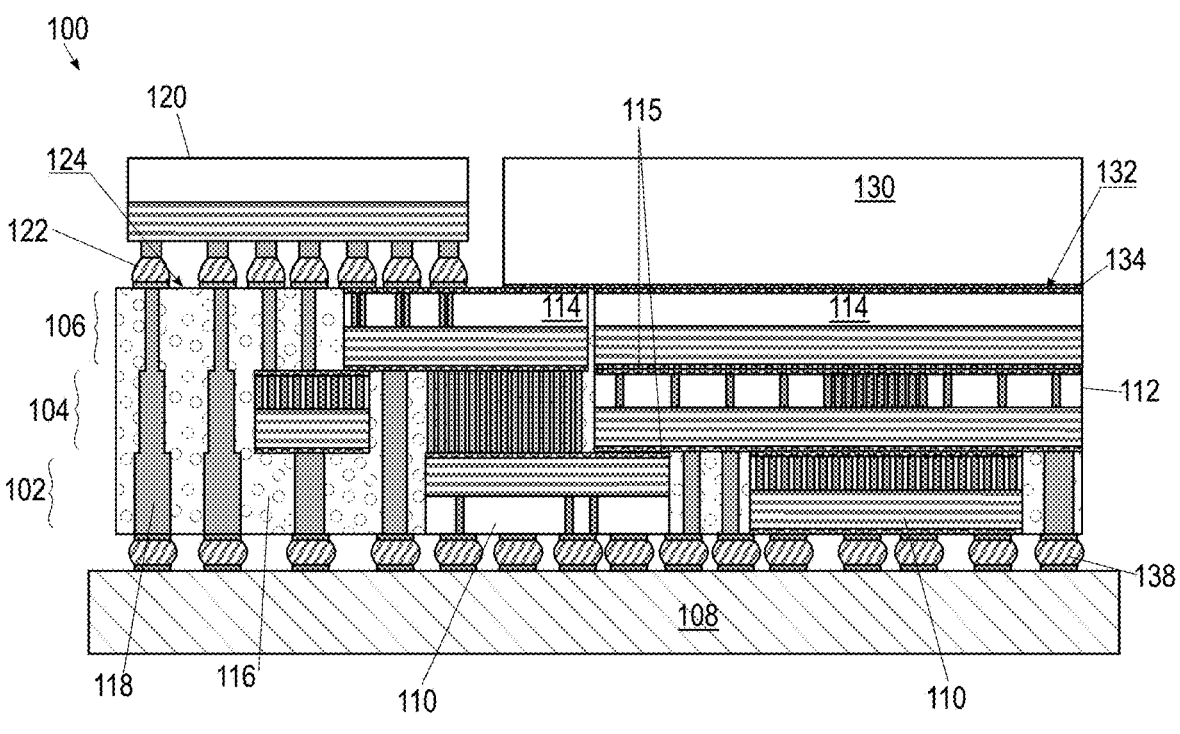
FIG. 1A
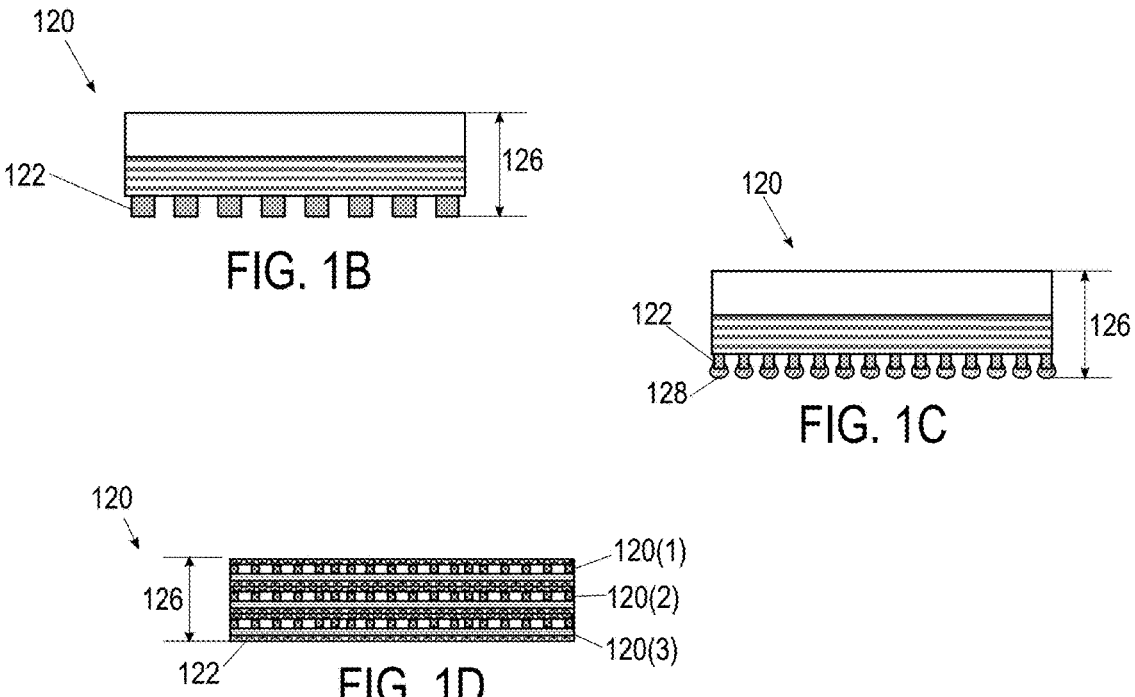
FIG. 1B
FIG. 1C
FIG. 1D

700

702 — CARRIER=LAYER *i*

704 — ATTACH LAYER *i*+1 OF IC DIES OVER LAYER *i*

706 — ATTACH LAYER *i*+2 OF IC DIES OVER LAYER *i*+1

708 — GENERATE CAVITY FOR STACKED DIE

710 — ATTACH STACKED DIE IN CAVITY

712 — PLANARIZE LAYER *i*+2

714 — STRUCTURE COMPLETED?

STRUCTURE=LAYER *i*

716

NO

YES

718 — DEBOND FROM CARRIER

720 — PLATE BUMPS, DICE INTO INDIVIDUAL UNITS, ATTACH EACH UNIT TO PACKAGE SUBSTRATE

INTEGRATED PACKAGING ARCHITECTURE WITH SOLDER AND NON-SOLDER INTERCONNECTS

TECHNICAL FIELD

The present disclosure relates to techniques, methods, and apparatus directed to integrated packaging architecture with solder and non-solder interconnects in semiconductor integrated circuit (IC) packaging.

BACKGROUND

Electronic circuits when commonly fabricated on a wafer of semiconductor material, such as silicon, are called ICs. The wafer with such ICs is typically cut into numerous individual dies. The dies may be packaged into an IC package containing one or more dies along with other electronic components such as resistors, capacitors, and inductors. The IC package may be integrated onto an electronic system, such as a consumer electronic system, or servers, such as mainframes.

BRIEF DESCRIPTION OF THE DRAWINGS

Embodiments will be readily understood by the following detailed description in conjunction with the accompanying drawings. To facilitate this description, like reference numerals designate like structural elements. Embodiments are illustrated by way of example, and not by way of limitation, in the figures of the accompanying drawings.

FIG. 1A is a simplified cross-sectional view of an example microelectronic assembly according to some embodiments of the present disclosure.

FIG. 1B is a simplified cross-sectional view of an example embodiment of an IC die in the microelectronic assembly of FIG. 1A, according to some embodiments of the present disclosure.

FIG. 1C is a simplified cross-sectional view of another example embodiment of an IC die in the microelectronic assembly of FIG. 1A, according to some embodiments of the present disclosure.

FIG. 1D is a simplified cross-sectional view of yet another example embodiment of an IC die in the microelectronic assembly of FIG. 1A, according to some embodiments of the present disclosure.

DETAILED DESCRIPTION

Overview

Figure 2:
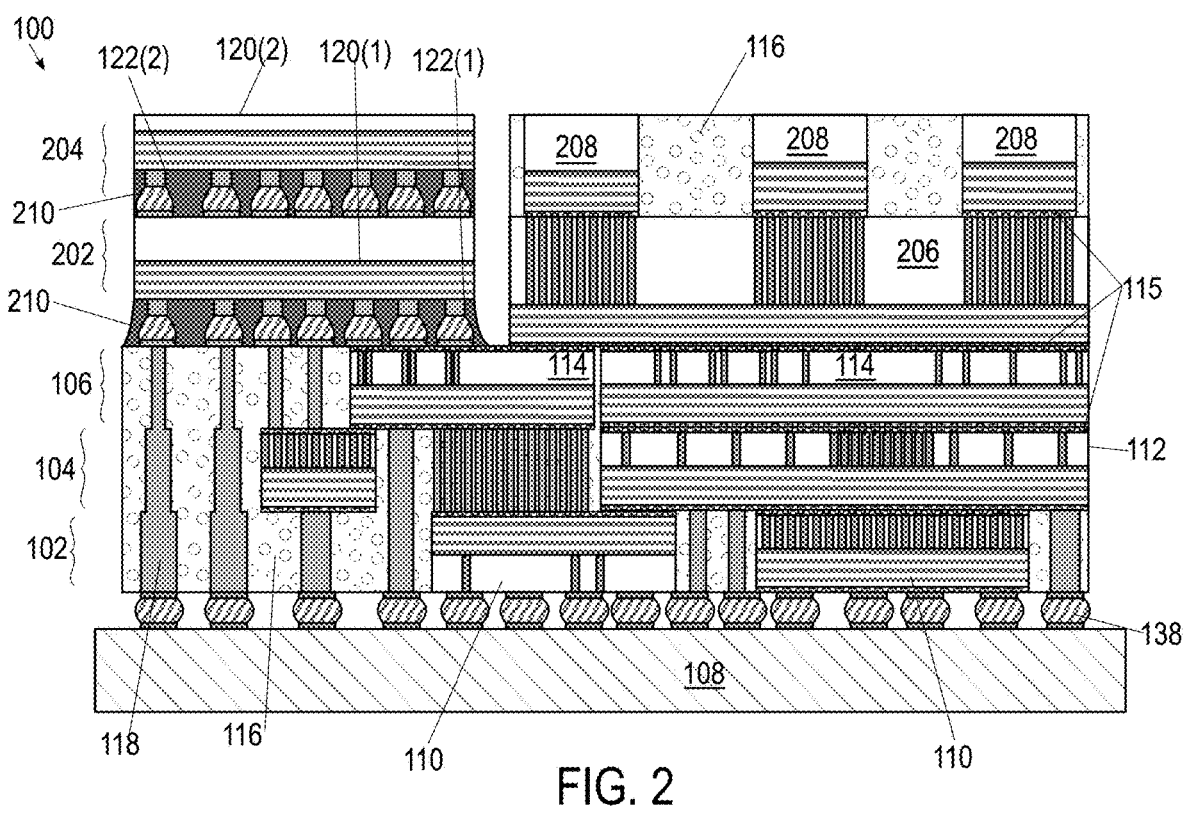
FIG. 2 is a simplified cross-sectional view of another example microelectronic assembly according to some embodiments of the present disclosure.

For purposes of illustrating IC packages described herein, it is important to understand phenomena that may come into play during assembly and packaging of ICs. The following foundational information may be viewed as a basis from which the present disclosure may be properly explained. Such information is offered for purposes of explanation only and, accordingly, should not be construed in any way to limit the broad scope of the present disclosure and its potential applications.

Advances in semiconductor processing and logic design have permitted an increase in the amount of logic circuits that may be included in processors and other IC devices. As a result, many processors now have multiple cores that are monolithically integrated on a single die. Generally, these types of monolithic ICs are also described as planar since they take the form of a flat surface and are typically built on a single silicon wafer made from a monocrystalline silicon boule. The typical manufacturing process for such monolithic ICs is called a planar process, allowing photolithography, etching, heat diffusion, oxidation, and other such processes to occur on the surface of the wafer, such that active circuit elements (e.g., transistors and diodes) are formed on the planar surface of the silicon wafer.

Current technologies permit hundreds and thousands of such active circuit elements to be formed on a single die so that numerous logic circuits may be enabled thereon. In such monolithic dies, the manufacturing process must be optimized for all the circuits equally, resulting in trade-offs between different circuits. In addition, because of the limitation of having to place circuits on a planar surface, some circuits are farther apart from some others, resulting in decreased performance such as longer delays. The manufacturing yield may also be severely impacted because the entire die may have to be discarded if even one circuit is malfunctional.

One solution to overcome such negative impacts of monolithic dies is to disaggregate the circuits into smaller IC dies (e.g., chiplets, tiles) electrically coupled by interconnect bridges. The smaller dies are part of an assembly of interconnected dies that together form a complete IC in terms of application and/or functionality, such as a memory chip, microprocessor, microcontroller, commodity IC (e.g., chip used for repetitive processing routines, simple tasks, application specific IC, etc.), and system-on-a-chip (SOC). In other words, the individual dies are connected together to create the functionalities of a monolithic IC. By using separate dies, each individual die can be designed and manufactured optimally for a particular functionality. For example, a processor core that contains logic circuits might aim for performance, and thus might require a very speed-optimized layout. This has different manufacturing requirements compared to a Universal Serial Bus (USB) controller, which is built to meet certain USB standards, rather than for processing speed. Thus, by having different parts of the overall design separated into different dies, each one optimized in terms of design and manufacturing, the overall yield and cost of the combined die solution may be improved.

The connectivity between these dies is achievable by many different ways. Wire bonding, C4 solder bump, and, copper pillar with solder cap, which are examples of mainstream electronic packaging micro-interconnection technology for many electronic devices, including smartphones, central processing units (CPU) and analog devices, are not sufficient to meet the interconnectivity demands of such architecture. Thus, to meet current and future demands, heterogenous integration, 2.5D electronic packaging using embedded die bridge/passive interposer, three-dimensional (3D) packaging using through-substrate vias (TSVs) are being developed. For example, in 2.5D packaging solutions, a silicon interposer and through-substrate vias (TSVs) (also called through-silicon vias where the substrate is silicon), connect dies at silicon-interconnect speed in a minimal footprint. In another example, called Embedded Multi-Die Interconnect Bridge (EMIB), a silicon bridge embedded under the edges of two interconnecting dies facilitates electrical coupling between them. In the 3D architecture, the dies are stacked one above the other, creating a smaller footprint overall. Typically, the electrical connectivity and mechanical coupling in such 3D architecture is achieved using TSVs and high pitch solder-based bumps (e.g., C2 interconnections). The EMIB and the 3D stacked architecture may also be combined using an omni-directional interconnect (ODI), in which EMIB chips are embedded in an organic mold compound, which allows for top-packaged chips to communicate with other chips horizontally using EMIB and vertically, using through-mold vias (TMVs) which are typically larger than TSVs. However, these current interconnect technologies use solder or its equivalent for connectivity, with consequent low vertical and horizontal interconnect density.

One way to mitigate low vertical interconnect density is to use an interposer, which improves vertical interconnect density but suffers from low lateral interconnect density if the base wafer of the interposer is passive. In a general sense, an "interposer" is commonly used to refer to a base piece of silicon that interconnects two dies. By including active circuitry in the interposer, lateral speeds may be improved, but it requires more expensive manufacturing processes, in particular when a large base die is used to interconnect smaller dies. Additionally, not all interfaces require fine-pitch connections which may lead to additional manufacturing and processing overheads without the benefits of the fine-pitch. Thus, typical modular server architectures for complex and customized server configurations continue to use large monolithic dies to avoid disaggregation overheads.

In this regard, a quasi-monolithic hierarchical integration architecture using recursively coupled plurality of dies to form microelectronic assemblies helps to mitigate several drawbacks mentioned above. The plurality of dies may comprise active dies and/or passive dies, and at least a portion in the plurality of dies are coupled using die-to-die (DTD) interconnects with sub-10 micrometer pitch, also referred to as "hybrid bonds," "hybrid interconnects," or "direct bond interconnects." In other words, the center-to-center separation between adjacent high-density interconnects is less than or equal to 10 micrometer. In such quasi-monolithic structures, IC dies are stacked in multiple layers with inorganic dielectric between the layers and around the IC dies. Electrical coupling through the dielectric is implemented with through-dielectric vias (TDVs).

Wafer to wafer (or panel to panel) bonding may be used to manufacture such quasi-monolithic hierarchically integrated architecture. Wafer to wafer hybrid bonding is known in the art, for example, it has been adopted to build high-density complementary metal-oxide semiconductor (CMOS) image sensors. In this type of configuration, multiple layers of silicon wafer are bonded together via hybrid bonding for achieving pixel-level integration with hundreds of thousands of interconnections. Yet, die to wafer integration—bonding individual dies to wafers—remains a challenge, especially for integration of silicon dies with different assembly form factors and interconnects, e.g., micro-bump die, fine-pitch copper pillar die, and singulated stacked dies in die to wafer stacking, making true heterogeneous integration—integration of dies manufactured by different processes into a single package—a challenge for high-volume manufacturing, because not all processes can achieve the sub-10 micron pitch necessary for hybrid bonds at a reasonable cost. For example, IC dies with micro-bumps have interconnect pitch in a range between 10 microns and 80 microns; IC dies with solder-capped copper pillars have interconnect pitch between 80 microns and 150 microns. Further, stacked dies have a different thickness than a single die, causing problems in integrating them into a multi-layer quasi-monolithic package in a die to wafer process flow.

Embodiments of the present disclosure provide a microelectronic assembly comprising: a first IC die coupled to a surface with first interconnects having a first pitch; and a second IC die coupled to the surface with second interconnects having a second pitch. The second pitch is greater than the first pitch, and the first pitch is less than 10 micrometers. In some embodiments, the first interconnects are distributed with silicon-level interconnect density.

As used herein, the term "silicon-level" interconnect density comprises interconnect density greater than 10,000 connections per square millimeter. The term refers to trace pitch and/or via density that is generally found within an IC die (e.g., in metallization layers of the IC die above the active region) as opposed to interconnect density between IC dies of older packaging technologies (e.g., solder-based C4 or larger interconnects). Interconnects with silicon-level interconnect density may have pitch ranging between 0.5 micrometer and 10 micrometer (i.e., in one embodiment, the interconnects may have a pitch of 0.5 micrometer; in another embodiment, the interconnects may have a pitch of 2 micrometer; in yet another embodiment, some interconnects may have a pitch of 0.5 micrometers and some other interconnects may have a pitch of 10 micrometers; etc.). In that regard, some DTD interconnects, such as hybrid bonds, have silicon-level interconnect density.

Embodiments of the present disclosure also provide an IC package comprising: a first plurality of IC dies in a first layer; a first IC die in a second layer coupled to a surface of the first layer with first interconnects having a first pitch; and a second IC die in the second layer coupled to the surface of the first layer with second interconnects having a second pitch. The second pitch is greater than the first pitch, and the first pitch is less than 10 micrometers.

Embodiments of the present disclosure also provide a method comprising: attaching an IC die to a first surface of a first layer with first interconnects having a first pitch, in which the first layer comprises IC dies in dielectric; depositing dielectric around the first IC die to form a second layer; forming a cavity in the dielectric to expose a portion of the surface of the first layer; dispensing no-flow underfill in the cavity; coupling another IC die to the exposed portion of the first surface of the first layer with second interconnects having a second pitch larger than the first pitch; and planarizing a second surface of the second layer to expose third surfaces of the IC die and the another IC die opposite to the first surface.

As used herein, the term "no-flow underfill" refers to a class of underfill materials known in the art that are dispensed before assembly of solder interconnects and cured during the solder reflow process. Traditional underfill materials that flow are dispensed after the solder reflow process into a space between a top component and a bottom component coupled together with solder interconnects; the traditional underfill material flows by capillary action into the space and around the solder interconnects and then solidifies during a curing process, for example, heating in an oven. In contrast, no-flow underfill is dispensed before the top component is coupled to the bottom component. To ensure that the solder balls of the top component connect to the pads on the bottom component, some no-flow underfill does not contain particulate filler material, although other no-flow underfill may contain particulate fillers, such as silica. The no-flow underfill typically cures during the solder reflow process, thereby eliminating an additional curing step as with traditional underfill materials. No-flow underfill may comprise epoxy resin in general, with hexahydro-4-methyl phthalic anhydride and metal acetylacetonate material systems in some embodiments. Some n-flow underfill materials may contain acidic flux, which convert to resin during cure.

Each of the structures, assemblies, packages, methods, devices, and systems of the present disclosure may have several innovative aspects, no single one of which is solely responsible for all the desirable attributes disclosed herein. Details of one or more implementations of the subject matter described in this specification are set forth in the description below and the accompanying drawings.

In the following detailed description, various aspects of the illustrative implementations may be described using terms commonly employed by those skilled in the art to convey the substance of their work to others skilled in the art.

The terms "circuit" and "circuitry" mean one or more passive and/or active electrical and/or electronic components that are arranged to cooperate with one another to provide a desired function. The terms also refer to analog circuitry, digital circuitry, hard wired circuitry, programmable circuitry, microcontroller circuitry and/or any other type of physical hardware electrical and/or electronic component.

The term "integrated circuit" means a circuit that is integrated into a monolithic semiconductor or analogous material.

In some embodiments, the IC dies disclosed herein may comprise substantially monocrystalline semiconductors, such as silicon or germanium, as a base material on which integrated circuits are fabricated with traditional semiconductor processing methods. The semiconductor base material may include, for example, N-type pr P-type materials. Dies may include, for example, a crystalline base material formed using a bulk silicon (or other bulk semiconductor material) or a semiconductor-on-insulator (SOI, e.g., a silicon-on-insulator) structure. In some other embodiments, the base material of one or more of the IC dies may comprise alternate materials, which may or may not be combined with silicon, that include but are not limited to germanium, indium antimonide, lead telluride, indium arsenide, indium phosphide, gallium arsenide, indium gallium arsenide, gallium antimonide, or other combinations of group III-N, group III-V, group II-VI, or group IV materials. In yet other embodiments, the base material may comprise compound semiconductors, for example, with a first sub-lattice of at least one element from group III of the periodic table (e.g., Al, Ga, In), and a second sub-lattice of at least one element of group V of the periodic table (e.g., P, As, Sb). In yet other embodiments, the base material may comprise an intrinsic IV or III-V semiconductor material or alloy, not intentionally doped with any electrically active impurity; in alternate embodiments, nominal impurity dopant levels may be present. In still other embodiments, dies may comprise a non-crystalline material, such as polymers; for example, the base material may comprise silica-filled epoxy. In other embodiments, the base material may comprise high mobility oxide semiconductor material, such as tin oxide, antimony oxide, indium oxide, indium tin oxide, titanium oxide, zinc oxide, indium zinc oxide, indium gallium zinc oxide (IGZO), gallium oxide, titanium oxynitride, ruthenium oxide, or tungsten oxide. In general, the base material may include one or more of tin oxide, cobalt oxide, copper oxide, antimony oxide, ruthenium oxide, tungsten oxide, zinc oxide, gallium oxide, titanium oxide, indium oxide, titanium oxynitride, indium tin oxide, indium zinc oxide, nickel oxide, niobium oxide, copper peroxide, IGZO, indium telluride, molybdenite, molybdenum diselenide, tungsten diselenide, tungsten disulfide, N- or P-type amorphous or polycrystalline silicon, germanium, indium gallium arsenide, silicon germanium, gallium nitride, aluminum gallium nitride, indium phosphide, and black phosphorus, each of which may possibly be doped with one or more of gallium, indium, aluminum, fluorine, boron, phosphorus, arsenic, nitrogen, tantalum, tungsten, and magnesium, etc. Although a few examples of the material for dies are described here, any material or structure that may serve as a foundation (e.g., base material) upon which IC circuits and structures as described herein may be built falls within the spirit and scope of the present disclosure.

Unless described otherwise, IC dies described herein include one or more IC structures (or, simply, "ICs") implementing (i.e., configured to perform) certain functionality. In one such example, the term "memory die" may be used to describe a die that includes one or more ICs implementing memory circuitry (e.g., ICs implementing one or more of memory devices, memory arrays, control logic configured to control the memory devices and arrays, etc.). In another such example, the term "compute die" may be used to describe a die that includes one or more ICs implementing logic/compute circuitry (e.g., ICs implementing one or more of I/O functions, arithmetic operations, pipelining of data, etc.).

In another example, the terms "package" and "IC package" are synonymous, as are the terms "die" and "IC die." Note that the terms "chip," "die," and "IC die" are used interchangeably herein.

The term "insulating" means "electrically insulating," the term "conducting" means "electrically conducting," unless otherwise specified. With reference to optical signals and/or devices, components and elements that operate on or using optical signals, the term "conducting" can also mean "optically conducting."

The terms "oxide," "carbide," "nitride," etc. refer to compounds containing, respectively, oxygen, carbon, nitrogen, etc.

The term "high-k dielectric" refers to a material having a higher dielectric constant than silicon oxide, while the term "low-k dielectric" refers to a material having a lower dielectric constant than silicon oxide.

The term "insulating material" or "insulator" (also called herein as "dielectric material" or "dielectric") refers to solid materials (and/or liquid materials that solidify after processing as described herein) that are substantially electrically nonconducting. They may include, as examples and not as limitations, organic polymers and plastics, and inorganic materials such as ionic crystals, porcelain, glass, silicon, silicon oxide, silicon carbide, silicon carbonitride, silicon nitride, and alumina or a combination thereof. They may include dielectric materials, high polarizability materials, and/or piezoelectric materials. They may be transparent or opaque without departing from the scope of the present disclosure. Further examples of insulating materials are underfills and molds or mold-like materials used in packaging applications, including for example, materials used in organic interposers, package supports and other such components.

In various embodiments, elements associated with an IC may include, for example, transistors, diodes, power sources, resistors, capacitors, inductors, sensors, transceivers, receivers, antennas, etc. In various embodiments, elements associated with an IC may include those that are monolithically integrated within an IC, mounted on an IC, or those connected to an IC. The ICs described herein may be either analog or digital and may be used in a number of applications, such as microprocessors, optoelectronics, logic blocks, audio amplifiers, etc., depending on the components associated with the IC. The ICs described herein may be employed in a single IC die or as part of a chipset for executing one or more related functions in a computer.

In various embodiments of the present disclosure, transistors described herein may be field effect transistors (FETs), e.g., metal-oxide semiconductor field effect transistors (MOSFETs). In general, a FET is a three-terminal device that includes source, drain, and gate terminals and uses electric field to control current flowing through the device. A FET typically includes a channel material, a source region and a drain regions provided in and/or over the channel material, and a gate stack that includes a gate electrode material, alternatively referred to as a "work function" material, provided over a portion of the channel material (the "channel portion") between the source and the drain regions, and optionally, also includes a gate dielectric material between the gate electrode material and the channel material.

In a general sense, an "interconnect" refers to any element that provides a physical connection between two other elements. For example, an electrical interconnect provides electrical connectivity between two electrical components, facilitating communication of electrical signals between them; an optical interconnect provides optical connectivity between two optical components, facilitating communication of optical signals between them. As used herein, both electrical interconnects and optical interconnects are comprised in the term "interconnect." The nature of the interconnect being described is to be understood herein with reference to the signal medium associated therewith. Thus, when used with reference to an electronic device, such as an IC that operates using electrical signals, the term "interconnect" describes any element formed of an electrically conductive material for providing electrical connectivity to one or more elements associated with the IC or/and between various such elements. In such cases, the term "interconnect" may refer to both conductive traces (also sometimes referred to as "lines," "wires," "metal lines" or "trenches") and conductive vias (also sometimes referred to as "vias" or "metal vias"). Sometimes, electrically conductive traces and vias may be referred to as "conductive traces" and "conductive vias", respectively, to highlight the fact that these elements include electrically conductive materials such as metals. Likewise, when used with reference to a device that operates on optical signals as well, such as a photonic IC (PIC), "interconnect" may also describe any element formed of a material that is optically conductive for providing optical connectivity to one or more elements associated with the PCI. In such cases, the term "interconnect" may refer to optical waveguides (e.g., structures that guide and confine light waves), including optical fiber, optical splitters, optical combiners, optical couplers, and optical vias.

The term "conductive trace" may be used to describe an electrically conductive element isolated by an insulating material. Within IC dies, such insulating material comprises interlayer low-k dielectric that is provided within the IC die. Within package substrates, and printed circuit boards (PCBs) such insulating material comprises organic materials such as Ajinomoto Buildup Film (ABF), polyimides, or epoxy resin. Such conductive lines are typically arranged in several levels, or several layers, of metallization stacks.

The term "conductive via" may be used to describe an electrically conductive element that interconnects two or more conductive lines of different levels of a metallization stack. To that end, a via may be provided substantially perpendicularly to the plane of an IC die/chip or a support structure over which an IC structure is provided and may interconnect two conductive lines in adjacent levels or two conductive lines in non-adjacent levels.

The term "metallization stack" may be used to refer to a stack of one or more interconnects for providing connectivity to different circuit components of an IC die/chip and/or a package substrate.

As used herein, the term "pitch" of interconnects refers to a center-to-center distance between adjacent interconnects.

In context of a stack of dies coupled to one another or in context of a die coupled to a package substate, the term "interconnect" may also refer to, respectively, DTD interconnects and die-to-package substrate (DTPS) interconnects.

Although not specifically shown in all of the present illustrations in order to not clutter the drawings, when DTD or DTPS interconnects are described, a surface of a first die may include a first set of conductive contacts, and a surface of a second die or a package substrate may include a second set of conductive contacts. One or more conductive contacts of the first set may then be electrically and mechanically coupled to some of the conductive contacts of the second set by the DTD or DTPS interconnects.

In some embodiments, the pitch of the DTD interconnects may be different from the pitch of the DTPS interconnects, although, in other embodiments, these pitches may be substantially the same.

The DTPS interconnects disclosed herein may take any suitable form. In some embodiments, a set of DTPS interconnects may include solder (e.g., solder bumps or balls that are subject to a thermal reflow to form the DTPS interconnects). DTPS interconnects that include solder may include any appropriate solder material, such as lead/tin, tin/bismuth, eutectic tin/silver, ternary tin/silver/copper, eutectic tin/copper, tin/nickel/copper, tin/bismuth/copper, tin/indium/copper, tin/zinc/indium/bismuth, or other alloys. In some embodiments, a set of DTPS interconnects may include an anisotropic conductive material, such as an anisotropic conductive film or an anisotropic conductive paste. An anisotropic conductive material may include conductive materials dispersed in a non-conductive material. In some embodiments, an anisotropic conductive material may include microscopic conductive particles embedded in a binder or a thermoset adhesive film (e.g., a thermoset biphenyl-type epoxy resin, or an acrylic-based material). In some embodiments, the conductive particles may include a polymer and/or one or more metals (e.g., nickel or gold). For example, the conductive particles may include nickel-coated gold or silver-coated copper that is in turn coated with a polymer. In another example, the conductive particles may include nickel. When an anisotropic conductive material is uncompressed, there may be no conductive pathway from one side of the material to the other. However, when the anisotropic conductive material is adequately compressed (e.g., by conductive contacts on either side of the anisotropic conductive material), the conductive materials near the region of compression may contact each other so as to form a conductive pathway from one side of the film to the other in the region of compression.

The DTD interconnects disclosed herein may take any suitable form. In some embodiments, some or all of the DTD interconnects in a microelectronic assembly or an IC package as described herein may be metal-to-metal interconnects (e.g., copper-to-copper interconnects, or plated interconnects). In such embodiments, the conductive contacts on either side of the DTD interconnect may be bonded together (e.g., under elevated pressure and/or temperature) without the use of intervening solder or an anisotropic conductive material. In some metal-to-metal interconnects, a dielectric material (e.g., silicon oxide, silicon nitride, silicon carbide) may be present between the metals bonded together (e.g., between copper pads or posts that provide the associated conductive contacts). In some embodiments, one side of a DTD interconnect may include a metal pillar (e.g., a copper pillar), and the other side of the DTD interconnect may include a metal contact (e.g., a copper contact) recessed in a dielectric. In some embodiments, a metal-to-metal interconnect (e.g., a copper-to-copper interconnect) may include a noble metal (e.g., gold) or a metal whose oxides are conductive (e.g., silver). In some embodiments, a metal-to-metal interconnect may include metal nanostructures (e.g., nanorods) that may have a reduced melting point. Metal-to-metal interconnects may be capable of reliably conducting a higher current than other types of interconnects; for example, some solder interconnects may form brittle intermetallic compounds when current flows, and the maximum current provided through such interconnects may be constrained to mitigate mechanical failure.

In some embodiments, the dies on either side of a set of DTD interconnects may be unpackaged dies.

In some embodiments, the DTD interconnects may include solder. For example, the DTD interconnects may include conductive bumps or pillars (e.g., copper bumps or pillars) attached to the respective conductive contacts by solder. In some embodiments, a thin cap of solder may be used in a metal-to-metal interconnect to accommodate planarity. In some embodiments, the solder used in some or all of the DTD interconnects may have a higher melting point than the solder included in some or all of the DTPS interconnects. For example, when the DTD interconnects in an IC package are formed before the DTPS interconnects are formed, solder-based DTD interconnects may use a higher-temperature solder (e.g., with a melting point above 200 degrees Celsius), while the DTPS interconnects may use a lower-temperature solder (e.g., with a melting point below 200 degrees Celsius). In some embodiments, a higher-temperature solder may include tin; tin and gold; or tin, silver, and copper (e.g., 96.5% tin, 3% silver, and 0.5% copper). In some embodiments, a lower-temperature solder may include tin and bismuth (e.g., eutectic tin bismuth), tin, silver, bismuth, indium, indium and tin, or gallium.

In some embodiments, a set of DTD interconnects may include an anisotropic conductive material, such as any of the materials discussed above for the DTPS interconnects. In some embodiments, the DTD interconnects may be used as data transfer lanes, while the DTPS interconnects may be used for power and ground lines, among others.

In microelectronic assemblies or IC packages as described herein, some or all of the DTD interconnects may have a finer pitch than the DTPS interconnects. In some embodiments, the DTPS interconnects disclosed herein may have a pitch between about 80 microns and 300 microns, while the DTD interconnects disclosed herein may have a pitch between about 0.5 microns and 100 microns, depending on the type of the DTD interconnects. An example of silicon-level interconnect density is provided by the density of some DTD interconnects. In some embodiments, the DTD interconnects may have too fine a pitch to couple to the package substrate directly (e.g., too fine to serve as DTPS interconnects). The DTD interconnects may have a smaller pitch than the DTPS interconnects due to the greater similarity of materials in the different dies on either side of a set of DTD interconnects than between a die and a package substrate on either side of a set of DTPS interconnects. In particular, the differences in the material composition of dies and package substrates may result in differential expansion and contraction of the die dies and package substrates due to heat generated during operation (as well as the heat applied during various manufacturing operations). To mitigate damage caused by this differential expansion and contraction (e.g., cracking, solder bridging, etc.), the DTPS interconnects in any of the microelectronic assemblies or IC packages as described herein may be formed larger and farther apart than DTD interconnects, which may experience less thermal stress due to the greater material similarity of the pair of dies on either side of the DTD interconnects.

It will be recognized that, unless otherwise specified, one more levels of underfill (e.g., organic polymer material such as benzotriazole, imidazole, polyimide, or epoxy) may be provided in an IC package described herein and may not be labeled in order to avoid cluttering the drawings. In various embodiments, the levels of underfill may comprise the same or different insulating materials. In some embodiments, the levels of underfill may comprise thermoset epoxies with silicon oxide particles; in some embodiments, the levels of underfill may comprise any suitable material that can perform underfill functions such as supporting the dies and reducing thermal stress on interconnects. In some embodiments, the choice of underfill material may be based on design considerations, such as form factor, size, stress, operating conditions, etc.; in other embodiments, the choice of underfill material may be based on material properties and processing conditions, such as cure temperature, glass transition temperature, viscosity and chemical resistance, among other factors; in some embodiments, the choice of underfill material may be based on both design and processing considerations. Unless otherwise specified, the underfills used in embodiments described herein are "no-flow" underfills as described previously.

In some embodiments, one or more levels of solder resist (e.g., epoxy liquid, liquid photoimageable polymers, dry film photoimageable polymers, acrylics, solvents) may be provided in an IC package described herein and may not be labeled or shown to avoid cluttering the drawings. Solder resist may be a liquid or dry film material including photoimageable polymers. In some embodiments, solder resist may be non-photoimageable.

The terms "substantially," "close," "approximately," "near," and "about," generally refer to being within +/−20% of a target value (e.g., within +/−5% or 10% of a target value) based on the context of a particular value as described herein or as known in the art.

Terms indicating orientation of various elements, e.g., "coplanar," "perpendicular," "orthogonal," "parallel," or any other angle between the elements, generally refer to being within +/−5%-20% of a target value based on the context of a particular value as described herein or as known in the art.

The term "connected" means a direct connection (which may be one or more of a mechanical, electrical, and/or thermal connection) between the things that are connected, without any intermediary devices, while the term "coupled" means either a direct connection between the things that are connected, or an indirect connection through one or more passive or active intermediary devices.

The description uses the phrases "in an embodiment" or "in embodiments," which may each refer to one or more of the same or different embodiments.

Furthermore, the terms "comprising," "including," "having," and the like, as used with respect to embodiments of the present disclosure, are synonymous.

The disclosure may use perspective-based descriptions such as "above," "below," "top," "bottom," and "side"; such descriptions are used to facilitate the discussion and are not intended to restrict the application of disclosed embodiments.

The terms "over," "under," "between," and "on" as used herein refer to a relative position of one material layer or component with respect to other layers or components. For example, one layer disposed over or under another layer may be directly in contact with the other layer or may have one or more intervening layers. Moreover, one layer disposed between two layers may be directly in contact with one or both of the two layers or may have one or more intervening layers. In contrast, a first layer described to be "on" a second layer refers to a layer that is in direct contact with that second layer. Similarly, unless explicitly stated otherwise, one feature disposed between two features may be in direct contact with the adjacent features or may have one or more intervening layers.

The term "dispose" as used herein refers to position, location, placement, and/or arrangement rather than to any particular method of formation.

The term "between," when used with reference to measurement ranges, is inclusive of the ends of the measurement ranges.

For the purposes of the present disclosure, the phrase "A and/or B" means (A), (B), or (A and B). For the purposes of the present disclosure, the phrase "A, B, and/or C" means (A), (B), (C), (A and B), (A and C), (B and C), or (A, B, and C). When used herein, the notation "A/B/C" means (A), (B), and/or (C).

Although certain elements may be referred to in the singular herein, such elements may include multiple sub-elements. For example, "an electrically conductive material" may include one or more electrically conductive materials. In another example, "a dielectric material" may include one or more dielectric materials.

Unless otherwise specified, the use of the ordinal adjectives "first," "second," and "third," etc., to describe a common object, merely indicate that different instances of like objects are being referred to, and are not intended to imply that the objects so described must be in a given sequence, either temporally, spatially, in ranking or in any other manner.

In the following detailed description, reference is made to the accompanying drawings that form a part hereof, and in which is shown, by way of illustration, embodiments that may be practiced. It is to be understood that other embodiments may be utilized, and structural or logical changes may be made without departing from the scope of the present disclosure. Therefore, the following detailed description is not to be taken in a limiting sense.

The accompanying drawings are not necessarily drawn to scale.

In the drawings, same reference numerals refer to the same or analogous elements/materials shown so that, unless stated otherwise, explanations of an element/material with a given reference numeral provided in context of one of the drawings are applicable to other drawings where element/materials with the same reference numerals may be illustrated. Further, the singular and plural forms of the labels may be used with reference numerals to denote a single one and multiple ones respectively of the same or analogous type, species, or class of element.

Furthermore, in the drawings, some schematic illustrations of example structures of various devices and assemblies described herein may be shown with precise right angles and straight lines, but it is to be understood that such schematic illustrations may not reflect real-life process limitations which may cause the features to not look so "ideal" when any of the structures described herein are examined using, e.g., images of suitable characterization tools such as scanning electron microscopy (SEM) images, transmission electron microscope (TEM) images, or non-contact profilometer. In such images of real structures, possible processing and/or surface defects could also be visible, e.g., surface roughness, curvature or profile deviation, pit or scratches, not-perfectly straight edges of materials, tapered vias or other openings, inadvertent rounding of corners or variations in thicknesses of different material layers, occasional screw, edge, or combination dislocations within the crystalline region(s), and/or occasional dislocation defects of single atoms or clusters of atoms. There may be other defects not listed here but that are common within the field of device fabrication and/or packaging.

In the drawings, a particular number and arrangement of structures and components are presented for illustrative purposes and any desired number or arrangement of such structures and components may be present in various embodiments.

Further, unless otherwise specified, the structures shown in the figures may take any suitable form or shape according to material properties, fabrication processes, and operating conditions.

Figure 10:
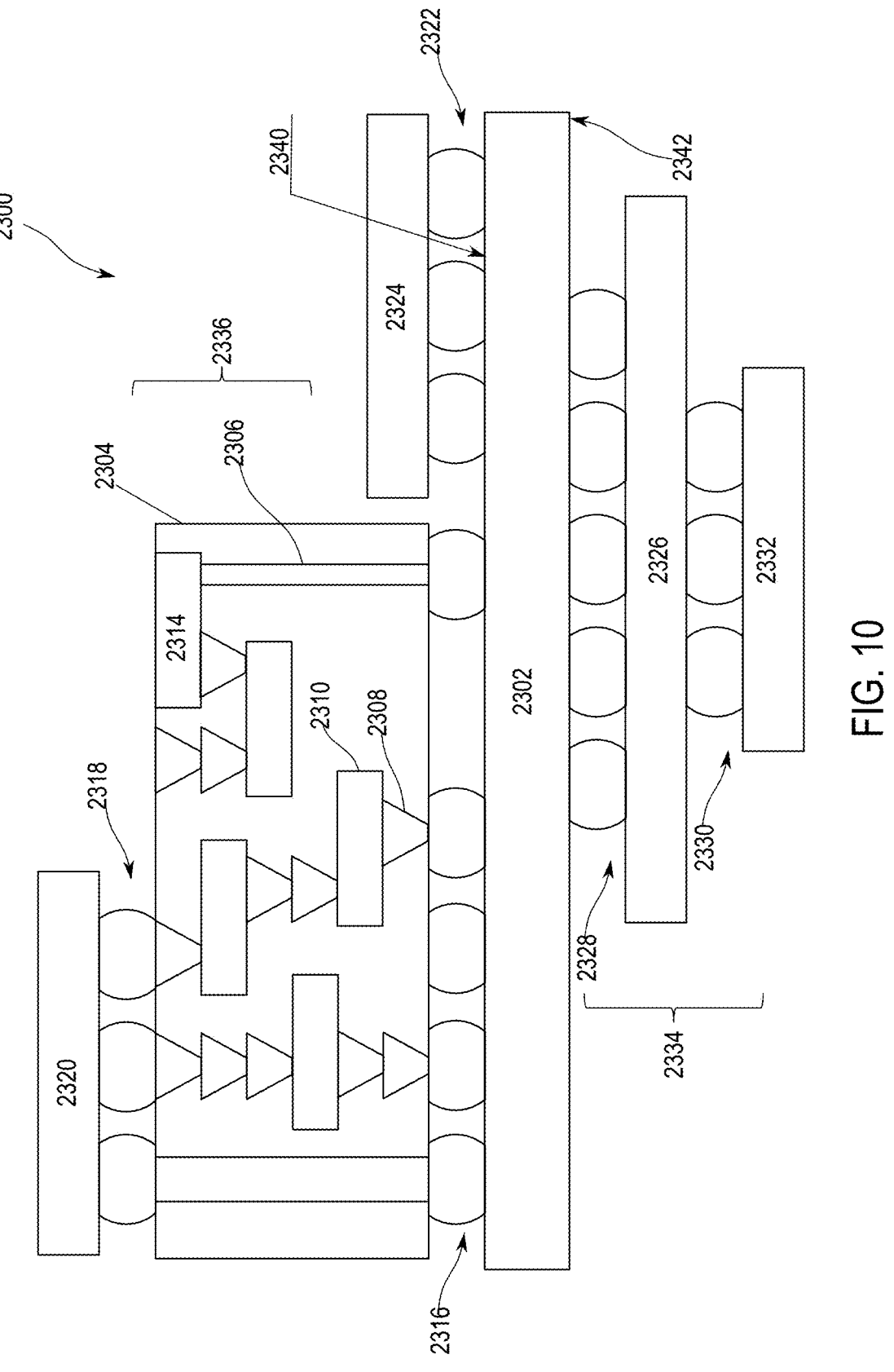
FIG. 10 is a cross-sectional side view of a device assembly that includes one or more microelectronic assemblies in accordance with any of the embodiments disclosed herein.

For convenience, if a collection of drawings designated with different letters are present (e.g., FIGS. 10A-10C), such a collection may be referred to herein without the letters (e.g., as "FIG. 10"). Similarly, if a collection of reference numerals designated with different letters are present (e.g., 110a-110e), such a collection may be referred to herein without the letters (e.g., as "110").

Various operations may be described as multiple discrete actions or operations in turn in a manner that is most helpful in understanding the exampled subject matter. However, the order of description should not be construed as to imply that these operations are necessarily order dependent. In particular, these operations may not be performed in the order of presentation. Operations described may be performed in a different order from the described embodiment. Various additional operations may be performed, and/or described operations may be omitted in additional embodiments.

Example Embodiments

FIG. 1A is a simplified cross-sectional view of a microelectronic assembly 100 according to some embodiments of the present disclosure. Microelectronic assembly 100 comprises a plurality of layers, for example, layer 102, layer 104 and layer 106. Only three layers are shown in the figure for ease of explanation, but it may be understood that any number of such layers may be provisioned in microelectronic assembly 100 within the broad scope of the embodiments. Layer 102 may be coupled to a package substrate 108.

In some embodiments, package substrate 108 may comprise multiple layers of conductive traces embedded in one or more layers of organic dielectric. For example, package substrate 108 may comprise a laminate substrate with several layers of metal planes or traces that are interconnected to each other by through-hole plated vias, with input/output routing planes on the top and bottom layers, while the inner layers are used as a ground and power plane. In other embodiments, package substrate 108 may comprise an organic interposer; in yet other embodiments, package substrate may comprise an inorganic interposer (e.g., made of glass, ceramic or semiconductor materials). In yet other embodiments, package substrate 108 may comprise a composite of organic and inorganic materials, for example, with an embedded semiconductor die in an organic substrate.

Each layer 102, 104 and 106 comprises one or more IC dies therein. For example, IC dies 110, 112 and 114 are in layers 102, 104 and 106 respectively. Each layer 102, 104 and 106 may be coupled to the adjacent layer with DTD interconnects 115. In some embodiments, DTD interconnects 115 may be provisioned only along coupled components, such as between IC dies 110 and 112 or between 112 and 114; in other embodiments, DTD interconnects 115 may be provisioned on the entire interface suitably, like a redistribution layer, for example between layers 102 and 104, and/or between layers 104 and 106. In some embodiments, DTD interconnects 115 between layers 104 and 106 may have the same pitch and interconnection density as DTD interconnects 115 between layers 102 and 104; in other embodiments, DTD interconnects 115 between layers 104 and 106 may be of a different pitch and density than DTD interconnects 115 between layers 102 and 104. In various embodiments, DTD interconnects 115 may comprise hybrid bonds having silicon-level interconnect density.

Each layer 102, 104 and 106 may comprise a dielectric 116 surrounding (or embedding) IC dies 110, 112 and 114 respectively. In some embodiments, dielectric 116 may comprise different materials in different layers; in other embodiments, the same material may pervade all layers in microelectronic assembly 100. In various embodiments, dielectric 116 may comprise inorganic materials, such as silicon oxide, silicon nitride, silicon oxynitride, silicon carbide, silicon carbonitride, etc. In some embodiments, dielectric 116 may comprise organic materials, such as polyimide, mold compounds, etc.

TDVs 118 may extend through dielectric 116 in one or more layers. For example, some TDVs 118 may be present only in layer 102 (e.g., coupling IC dies 114 and 110 through layer 104, or coupling IC die 112 with package substrate 108 through layer 102); some other TDVs 118 may be present in both layers 102 and 104 (e.g., directly coupling IC die 114 with package substrate 108 through layers 102 and 104). In some embodiments, all TDVs 118 may be of the same size; in other embodiments, TDVs 118 may be of different sizes, for example, some may carry power and may be larger than others that carry signals and are smaller. In some embodiments, some TDVs 118 may be differently sized in each layer, for example, being thickest in layer 102 proximate to package substrate 108 and thinnest in layer 106 farthest from package substrate 108. In some embodiments, some TDVs 118 may be spaced farther apart from each other than other TDVs 118, whereas in other embodiments, TDVs 118 may all be uniformly spaced apart, depending on their functionalities, assembly footprint, and other design and manufacturing considerations.

In various embodiments, IC die 120 may be coupled with interconnects 122 to an interface 124 on layer 106. Interconnects 122 may comprise interconnects of a larger pitch and lower interconnect density than DTD interconnects 115. FIGS. 1B-1D are simplified illustrations of cross-sections of various embodiments of IC die 120 and interconnects 122. As shown in FIG. 1B, interconnects 122 of IC die 120 may comprise copper pillars having a pitch between 80 micrometer and 150 micrometers in some embodiments. Copper pillars of interconnects 122 may comprise not only copper, but also other metals in smaller amounts, such as gold and/or indium. The cross-sectional dimension of each copper pillar may be around 50 micrometers to 100 micrometers. The copper pillars may be coupled to the surface of layer 106 with solder. In some embodiments, a no-flow underfill may be used to provide thermal and mechanical stability and reliability to the solder interconnections. IC die and interconnects together may have a thickness 126, for example, around 20-30 micrometers in different embodiments. In some embodiments, thickness 126 may be greater than 30 micrometers.

As shown in FIG. 1C, interconnects 122 of IC die 120 may comprise micro-bumps with solder caps 128 having a pitch of between 10 micrometers and 80 micrometers in some embodiments. The micro-bumps may comprise indium, gold, copper, or any other suitable conductive material known in the art. The cross-sectional dimension of each micro-bump may be around 20 micrometers to 50 micrometers. The micro-bumps may be coupled to the surface of layer 106 by a traditional solder reflow process, during which solder caps 128 melt and bond with the underlying bond pad. Thickness 126 of IC die 120 and interconnects 122 may be around 20-30 micrometers in different embodiments. In some embodiments, thickness 126 may be greater than 30 micrometers.

As shown in FIG. 1D, IC die 120 may comprise a stack of IC dies 120(1), 120(2) and 120(3) coupled with hybrid bonds. Each IC die 120(1)-120(3) may comprise metallization layers, TSVs and DTD interconnects on either side to enable electrical and mechanical coupling through the stack. The stack may have a thickness 126 of around 60-100 micrometer in some embodiments. Interconnects 122 in these embodiments may comprise hybrid bonds, similar to some embodiments of DTD interconnects 115.

Turning back to FIG. 1A, microelectronic assembly 100 may comprise a dummy IC die 130 coupled to interface 132 with layer 106 by DTD interconnects 134 having silicon-level interconnect density. Dummy IC die 130 may not have any electrical functionalities. In some embodiments, IC die 130 may comprise a piece of silicon with a layer comprising DTD interconnects 134. Dummy IC die 130 may provide heat transfer capabilities which may be facilitated by the silicon-level density of DTD interconnects 134. In some embodiments, dummy IC die 130 may provide sufficient silicon by volume for thermo-mechanical reliability, or may prevent large empty spaces over layer 106, or a mechanical support area for a heat sink or other heat transfer component attached thereover, and other advantages as based on particular needs and configurations.

Note that in the example embodiment shown in FIG. 1A, some IC dies are shown in a face-to-face (FTF) configuration, whereas some other IC dies are shown in a face-to-back (FTB) configuration. Although not shown, some IC dies may be coupled in a back-to-back (BTB) configuration without departing from the scope of the embodiments described herein. Further, although only two types of solder-based interconnects are described in the illustrations, any suitable DTD interconnects described previously, for example, flip-chips, may be used without departing from the broad scope of the embodiments.

Further, note that in FIG. 1A and in subsequent figures, the DTD interconnects (e.g., 115, 134) are shown as aligned at the respective interfaces merely for ease of illustration; in actuality, some or all of them may be misaligned. In addition, there may be other components, such as bond pads, landing pads, metallization, etc. present in the assembly that are not shown in the figures to prevent cluttering. Note that FIG. 1A is intended to show relative arrangements of the components within their assemblies, and that, in general, such assemblies may include other components that are not illustrated (e.g., various interfacial layers or various other components related to optical functionality, electrical connectivity, or thermal mitigation). For example, in some further embodiments, the assembly as shown in FIG. 1A may include more dies along with other electrical components. Additionally, although some components of the assemblies are illustrated in FIGS. 1A-1D as being planar rectangles or formed of rectangular solids, this is simply for ease of illustration, and embodiments of these assemblies may be curved, rounded, or otherwise irregularly shaped as dictated by and sometimes inevitable due to the manufacturing processes used to fabricate various components.

FIG. 2 is a simplified cross-sectional view of an example microelectronic assembly 100 according to various embodiments of the present disclosure. Microelectronic assembly 100 comprises layers 102, 104 and 106 as in the embodiment of FIG. 1A, and further comprises additional layers, for example, layer 202, and 204. Layer 102 comprises IC dies 110; layer 104 comprises IC dies 112; layer 106 comprises IC dies 114; layer 202 comprises IC dies 120(1) and 206; layer 204 comprise IC dies 120(2) and 208. IC dies (e.g., 110, 112, 114, 206, 208) other than IC dies 120(1) and 120(2) in microelectronic assembly 100 may be coupled by DTD interconnects 115 comprising hybrid bonds having a pitch of less than 10 micrometers in some embodiments. They may also be surrounded by dielectric 116 and TDVs 118 in many embodiments. Although only one such IC die 206 is shown in layer 202, it may be understood that many such IC dies 206 may be provisioned in layer 202 alongside IC die 120(1). Similarly, any number of IC dies 208 may also be provisioned in layer 204 alongside IC die 120(2).

IC die 120(1). Similarly, any number of IC dies 208 may also be provisioned in layer 204 alongside IC die 120(2).

IC dies 120(1) and 120(2) may be coupled to by interconnects 122(1) and 122(2) respectively that comprise solder-based interconnects in some embodiments. In some embodiments, interconnects 122(1) and 122(2) may be the same; in other embodiments, interconnects 122(1) and 122(2) may be different, for example, interconnects 122(1) may comprise copper pillars with pitch of around 100 microns as in the embodiment of FIG. 1B, and interconnects 122(2) may comprise micro-bumps with solder caps having pitch of around 60 microns as in the embodiment of FIG. 1C.

In embodiments where both interconnects 122(1) and 122(2) are comprised of solder, the solder material used for IC dies (e.g., 120(2)) in one of the layers (e.g., layer 204) may be of lower melting point than the solder material used for IC dies (e.g., 120(1)) in the other one of the layers (e.g., layer 202) based on the manufacturing flow. For example, in embodiments where layer 202 is formed before layer 204, the solder material used in interconnects 122(2) may comprise lower melting point solder than the solder material used in interconnects 122(1). In embodiments where interconnects 122(1) and 122(2) comprise solder, a no-flow underfill 210 may be used around the solder-based interconnects to enhance their stability and thermo-mechanical reliability.

Although IC dies 120(1) and 120(2) are shown one on top of another, IC dies 120(1) and 120(2) may be stacked in the separate layers 202 and 204 farther from each other. For example, IC die 120(2) may be coupled to IC die 206 in some embodiments. Likewise, one or more of IC dies 208 may be coupled to IC die 120(1) in some embodiments.

Figure 3:
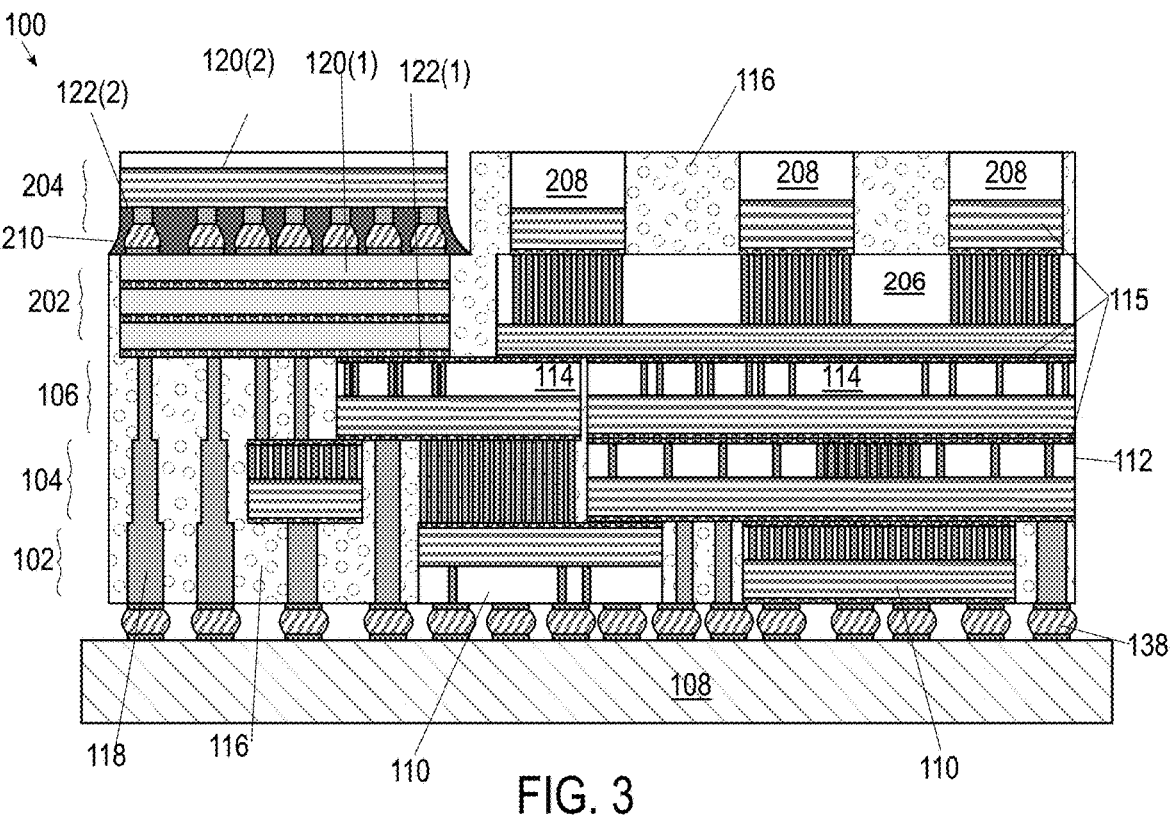
FIG. 3 is a simplified cross-sectional view of yet another example microelectronic assembly according to some embodiments of the present disclosure.

FIG. 3 is a simplified cross-sectional view of an example microelectronic assembly 100 according to various embodiments of the present disclosure. Microelectronic assembly 100 comprises layers 102, 104 and 106 as in the embodiment of FIG. 1A, and further comprises additional layers, for example, layer 202, and 204. Layer 102 comprises IC dies 110; layer 104 comprises IC dies 112; layer 106 comprises IC dies 114; layer 202 comprises IC dies 120(1) and 206; layer 204 comprise IC dies 120(2) and 208. IC dies (e.g., 110, 112, 114, 206, 208) other than IC dies 120(1) and 120(2) in microelectronic assembly 100 may be coupled by DTD interconnects 115 comprising hybrid bonds having a pitch of less than 10 micrometers in some embodiments. They may also be surrounded by dielectric 116 and TDVs 118 in many embodiments. Although only one such IC die 206 is shown in layer 202, it may be understood that many such IC dies 206 may be provisioned in layer 202 alongside IC die 120(1). Similarly, any number of IC dies 208 may also be provisioned in layer 204 alongside IC die 120(2).

IC dies 120(1) and 120(2) may be coupled to by interconnects 122(1) and 122(2) respectively. In some embodiments, IC die 120(1) may comprise a stack of IC dies, for example, as in the embodiment of FIG. 1D. In some embodiments, interconnects 122(1) may comprise hybrid bonds having pitch less than 10 micrometers, and interconnects 122(2) may comprise copper pillars with pitch of around 100 microns (as in FIG. 1B), or micro-bumps with solder caps having pitch of around 60 microns (as in FIG. 1C). In some embodiments, IC dies 120(1) and 120(2) may be flipped, so that the stack of IC dies is in layer 204 and the other one of IC die 120 may be in layer 202. Any solder-based interconnects may be surrounded and/or supported by no-flow underfill 210 in some embodiments.

Although IC dies 120(1) and 120(2) are shown one on top of another, IC dies 120(1) and 120(2) may be stacked in the separate layers 202 and 204 farther from each other. For example, IC die 120(2) may be coupled to IC die 206 in some embodiments. Likewise, one or more of IC dies 208 may be coupled to IC die 120(1) in some embodiments.

In various embodiments, any of the features discussed with reference to any of FIGS. 1A-2 herein may be combined with any other features to form a package with one or more IC dies as described herein, for example, to form a modified microelectronic assembly 100. Some such combinations are described above, but, in various embodiments, further combinations and modifications are possible.

Example Methods

Figures 4A, 4B, 4C, 4D, 4E:
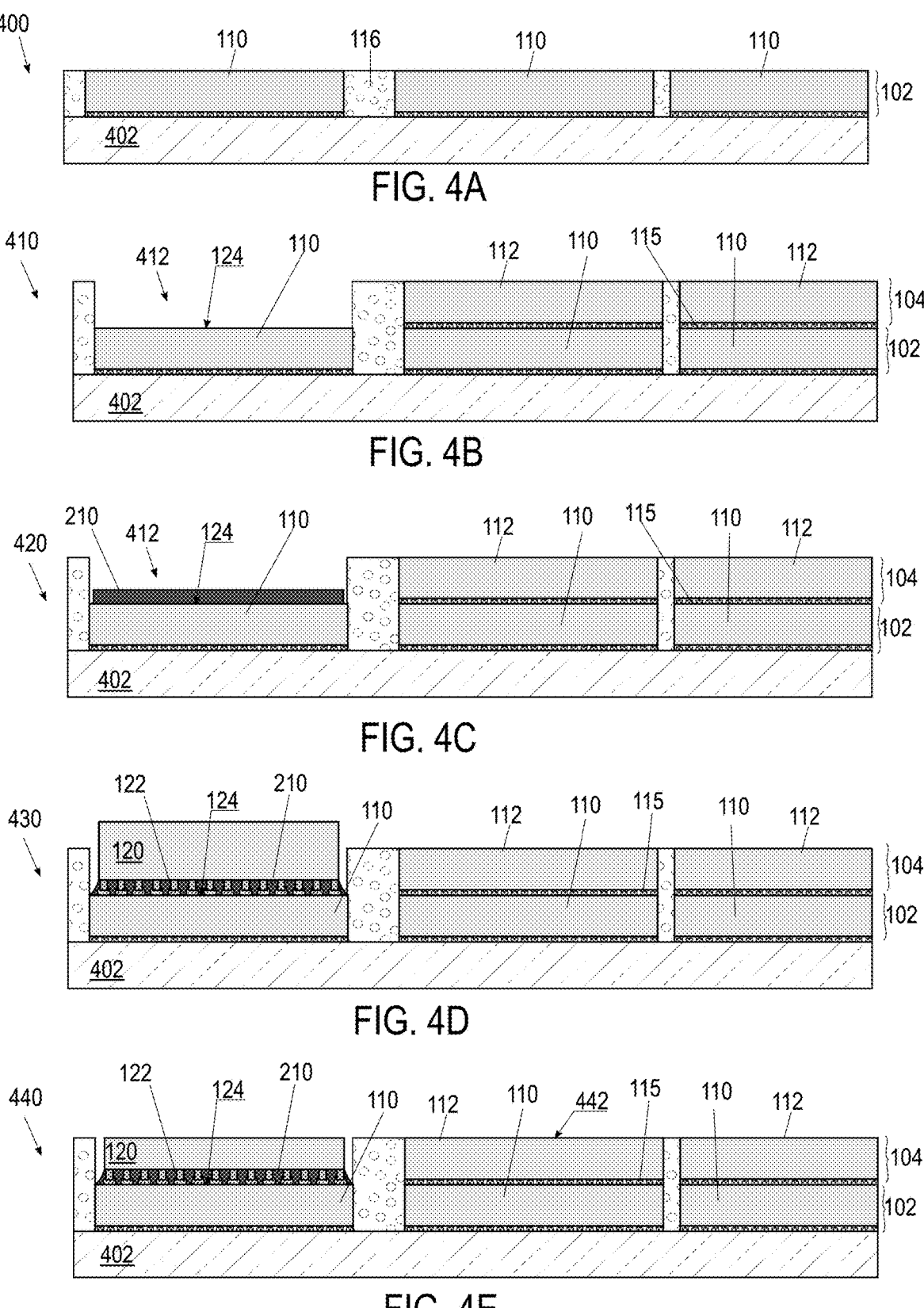
FIGS. 4A-4E are simplified cross-sectional views of various stages of manufacture of an example microelectronic assembly according to some embodiments of the present disclosure.

FIGS. 4A-4E are simplified cross-sectional views of various stages of manufacture of microelectronic assembly 100. FIG. 4A illustrates an assembly 400 comprising a carrier substrate 402 on which IC dies 110 of layer 102 may be attached, for example, using a removable adhesive. Carrier substrate 402 may comprise a wafer in some embodiments (e.g., wafer of approximately 300 mm diameter). In other embodiments, carrier substrate 402 may comprise a panel (e.g., panel approximately 500 mm×500 mm). Dielectric 116 may be deposited around IC dies 110. In some embodiments in which dielectric 116 comprises silicon nitride, silicon oxynitride, silicon carbide, silicon carbonitride, silicon oxide, or similar inorganic materials, dielectric 116 may be deposited by physical vapor deposition processes known in the art. Note that a removable adhesive layer between dielectric 116 and carrier substrate 402 may enable carrier substrate 402 to be debonded at a later state from dielectric 116 as appropriate. In some embodiments, TDVs 118 may also be formed in dielectric 116 using known processes in the art, for example, photolithography, etching, electroplating, etc.

FIG. 4B illustrates an assembly 410 subsequent to adding IC dies 112 of layer 104 over layer 102 and additional dielectric 116. IC dies 112 may be coupled to IC dies 110 with DTD interconnects 115. In some embodiments, dielectric 116 in layer 104 may be different from dielectric 116 in layer 102. In other embodiments (e.g., as shown), dielectric 116 may comprise the same material in layer 102 and layer 104. A cavity 412 may be created over layer 102, the footprint of cavity 412 corresponding to the footprint of IC die 120 (e.g., slightly larger within tolerances in some embodiments). In the embodiment shown, cavity 412 is created over IC die 110 in layer 102 to expose interface 124. In other embodiments, cavity 412 may be created over dielectric and bond pads of layer 102 to expose interface 124. In some embodiments, cavity 412 may be formed during deposition of dielectric 116 in layer 104, for example, by blocking deposition in that volume. In other embodiments, cavity 412 may be formed after deposition of dielectric 116, for example, by etching through deposited dielectric 116 until interface 124 is reached.

FIG. 4C illustrates an assembly 420 subsequent to depositing no-flow underfill 210 on interface 124 in cavity 412 with layer 102.

FIG. 4D illustrates an assembly 430 subsequent to attaching IC die 120 at interface 124 with interconnects 122. In the embodiment shown, interconnects 122 comprise micro-bumps with solder caps as in FIG. 1C. In other embodiments, interconnects 122 can comprise copper pillars (e.g., as in FIG. 1B) or C4 bumps or flip-chip bumps. IC die 120 may be pressed toward interface 124 so that interconnects 122 displace no-flow underfill 210 and contact conductive bond pads on interface 124. In some embodiments, a thermo-compression bonding (TCB) process known in the art may be performed to coupled IC die 120 to the bond pads on interface 124. Then, assembly 430 is subjected to a solder reflow operation, during which no-flow underfill 210 cures while the solder in interconnects 122 form a mechanical/chemical bond with the conductive pads on interface 124.

FIG. 4E illustrates an assembly 440 subsequent to polishing to reveal a substantially planar surface 442 of layer 104. In various embodiments, the polishing operation may be done by any suitable process known in the art for polishing silicon and/or oxides, nitrides, carbo-nitrides, etc. thereof. In one example embodiment, the polishing operation may be done by chemical mechanical polishing (CMP). In some embodiments, any space around IC die 120 in cavity 412 may be filled by dielectric 116 or other suitable material. In other embodiments, the space may be left as is. In various embodiments, surface 442 may be polished to facilitate further processing, for example, deposition of additional layers.

In some embodiments, in which the additional layers deposited over layer 104 comprise die stacks as illustrated in FIG. 1D, operations as described in reference to FIGS. 4A-4E may be followed. In embodiments where the additional layers deposited over layer 104 comprise other IC dies with solder-based interconnects, interconnects 122 may be chosen to comprise high-temperature solder that will not melt during later processing operations involving solder reflow for attaching other solder-based interconnects. In particular, the material for the solder in interconnects 122 may melt at a higher temperature than the solder in interconnects of other IC dies attached in subsequent operations. Further no-flow underfill 210 may provide mechanical stability to interconnects 122 during the subsequent solder reflow operations. For example, even if the solder melts, no-flow underfill 210 may prevent the melted solder from contacting adjacent interconnects and causing electrical shorts. Operations described in reference to FIGS. 4A-4E may be repeated as many times as necessary to build a multi-layered structure comprising solder and non-solder interconnects on a single carrier substrate 402.

In subsequent operations (not shown), assembly 440 may be debonded from carrier substrate 402 to expose a surface, which is plated with conductive pads and solder paste of DTPS interconnects 138 and then subjected to a solder reflow process to form solder bumps of DTPS interconnects 138. Thereafter, the assembly may be diced into individual microelectronic assemblies and each of the individual microelectronic assemblies may be coupled to respective package substrate 108 to form the structure as illustrated in FIG. 1A.

Although the operations as shown herein start the fabrication process with layer 102 closest to package substrate 108, the operations as described may be modified to start the fabrication process with the layer farthest from package substrate 108, for example, layer 104, and then proceeding to build underlying layers (e.g., 102) sequentially without departing from the scope of the embodiments of the present disclosure.

Figures 5A, 5B, 5C, 5D, 5E:
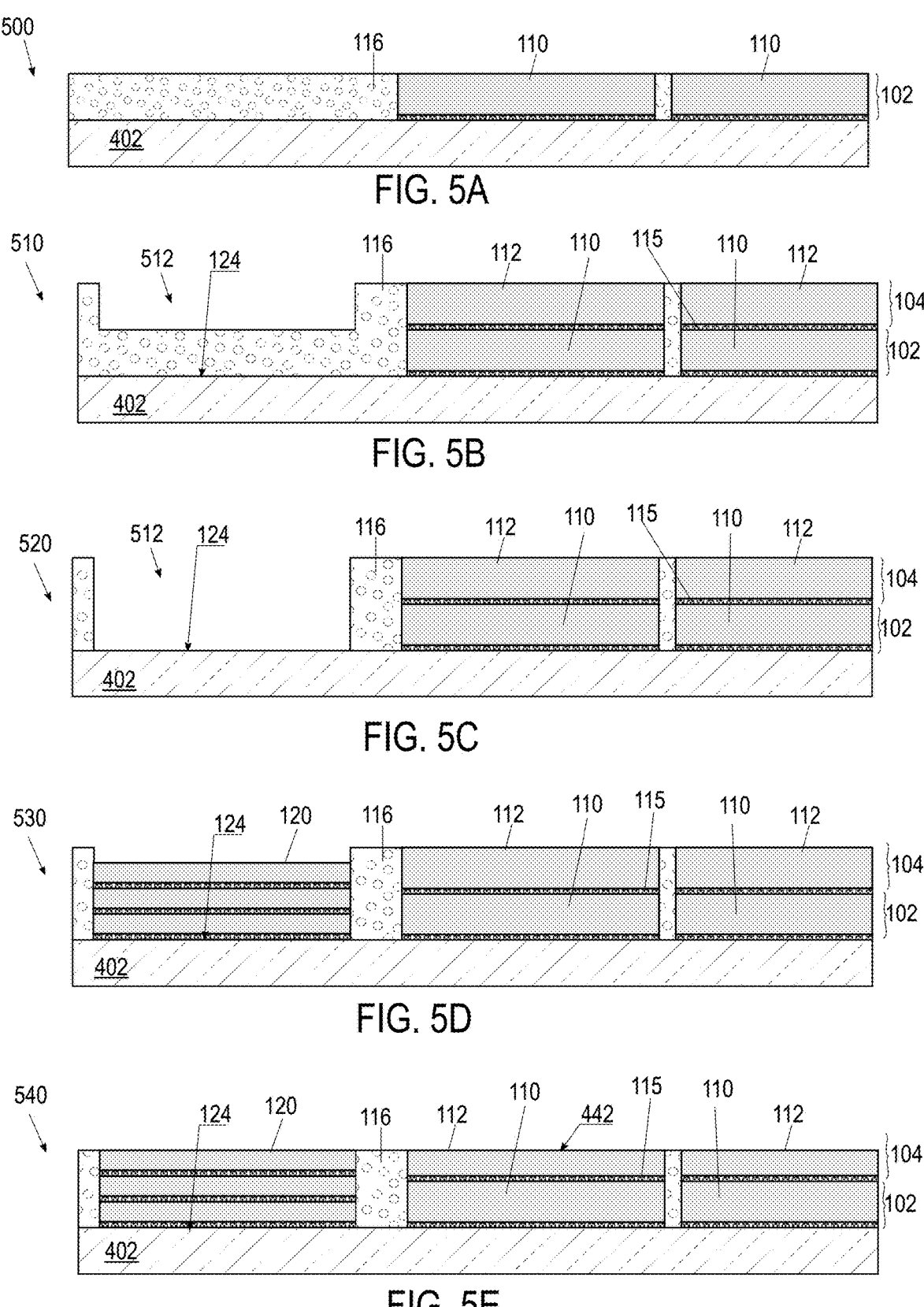
FIGS. 5A-5E are simplified cross-sectional views of various stages of manufacture of another example microelectronic assembly according to some embodiments of the present disclosure.

FIGS. 5A-5E are simplified illustrations showing various stages of manufacture of microelectronic assembly 100 comprising IC die 120 having a stack of several IC dies. FIG. 5A illustrates an assembly 500 comprising a carrier substrate 402 on which IC dies 110 of layer 102 may be attached, for example, using a removable adhesive. Carrier substrate 402 may comprise a wafer in some embodiments (e.g., wafer of approximately 300 mm diameter). In other embodiments, carrier substrate 402 may comprise a panel (e.g., panel approximately 500 mm×500 mm). Dielectric 116 may be deposited around IC dies 110. In some embodiments in which dielectric 116 comprises silicon nitride, silicon oxynitride, silicon carbide, silicon carbonitride, silicon oxide, or similar inorganic materials, dielectric 116 may be deposited by physical vapor deposition processes known in the art. Note that a removable adhesive layer between dielectric 116 and carrier substrate 402 may enable carrier substrate 402 to be debonded at a later state from dielectric 116 as appropriate. In some embodiments, TDVs 118 may also be formed in dielectric 116 using known processes in the art, for example, photolithography, etching, electroplating, etc.

FIG. 5B illustrates an assembly 510 subsequent to adding IC dies 112 of layer 104 over layer 102 and additional dielectric 116. IC dies 112 may be coupled to IC dies 110 with DTD interconnects 115. In some embodiments, dielectric 116 in layer 104 may be different from dielectric 116 in layer 102. In other embodiments (e.g., as shown), dielectric 116 may comprise the same material in layer 102 and layer 104. A cavity 512 may be created over layer 102, the footprint of cavity 512 corresponding to the footprint of IC die 120 (e.g., slightly larger within tolerances in some embodiments). In the embodiment shown, cavity 512 is created over layer 102 in dielectric 116 in an area where IC die 120 is to be attached. In some embodiments, cavity 512 may be formed during deposition of dielectric 116 in layer 104, for example, by blocking deposition in that volume. In other embodiments, cavity 512 may be formed after deposition of dielectric 116, for example, by etching through deposited dielectric 116.

FIG. 5C illustrates an assembly 520 subsequent to etching further so that cavity 512 extends to interface 124 with carrier substrate 402. Such deepening of cavity 512 is performed in those embodiments in which thickness 126 of IC die 120 comprising a stack of several IC dies is greater than the thickness of layer 102.

FIG. 5D illustrates an assembly 530 subsequent to attaching IC die 120 comprising a stack of IC dies at interface 124 with interconnects 122. In some embodiments in which interface 124 is the surface of carrier substrate 402, IC die 120 may be simply attached with an adhesive. In embodiments in which interface 124 is the surface of a layer, such as layer 102, IC die 120 may be attached by hybrid bond processing to couple IC die 120 to the underlying layer with interconnects 122 comprising hybrid bonds.

FIG. 5E illustrates an assembly 540 subsequent to polishing to reveal a substantially planar surface 442 of layer 104. In various embodiments, the polishing operation may be done by any suitable process known in the art for polishing silicon and/or oxides, nitrides, carbo-nitrides, etc. thereof. In one example embodiment, the polishing operation may be done by CMP. In some embodiments, any space around IC die 120 in cavity 512 may be filled by dielectric 116 or other suitable material. In other embodiments, the space may be left as is. In various embodiments, surface 442 may be polished to facilitate further processing, for example, deposition of additional layers. In some embodiments, in which the additional layers deposited over layer 104 comprise IC dies having solder-based interconnects, operations as described in referenced to FIGS. 5A-5E may be followed.

In subsequent operations (not shown), assembly 540 may be debonded from carrier substrate 402 to expose a surface, which is plated with conductive pads and solder paste of DTPS interconnects 138 and then subjected to a solder reflow process to form solder bumps of DTPS interconnects 138. Thereafter, the assembly may be diced into individual microelectronic assemblies and each of the individual microelectronic assemblies may be coupled to respective package substrate 108 to form the structure as illustrated in FIG. 1A.

Although the operations as shown herein start the fabrication process with layer 102 closest to package substrate 108, the operations as described may be modified to start the fabrication process with the layer farthest from package substrate 108, for example, layer 104, and then proceeding to build underlying layers (e.g., 102) sequentially without departing from the scope of the embodiments of the present disclosure.

Figure 6:
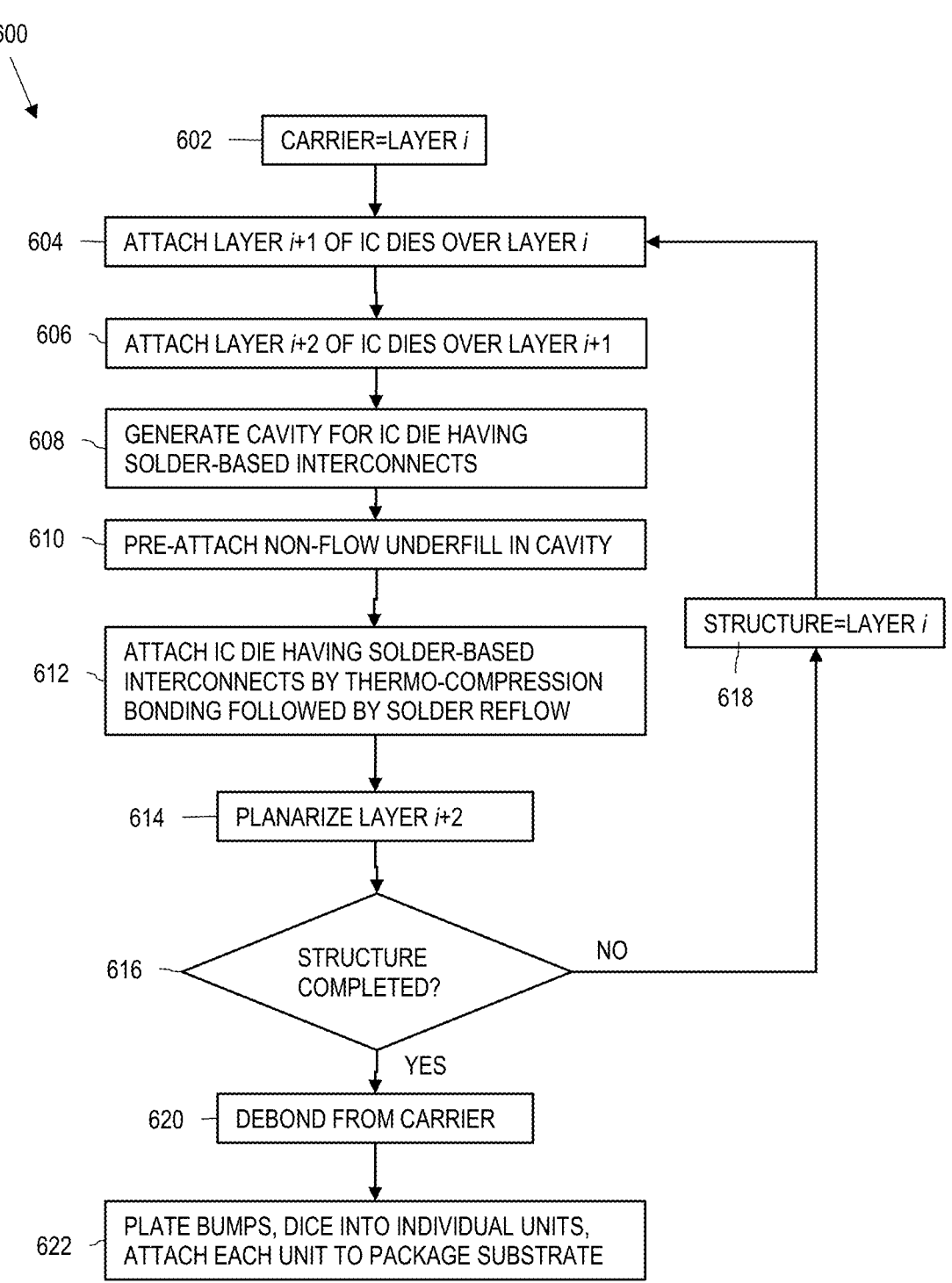
FIG. 6 is a simplified flow diagram illustrating example operations associated with manufacture of an example microelectronic assembly according to some embodiments of the present disclosure.

FIG. 6 is a simplified flow diagram illustrating example operations 600 that may be associated with manufacture of an example microelectronic assembly 100 according to various embodiments of the present disclosure. The operations start at 602, carrier substrate 402 being assigned to a layer i, 1=0 for this first step. At 604, layer i+1 (e.g., layer 102) is attached to layer i (e.g., carrier substrate 402). In many embodiments, the operation may comprise attaching IC dies (e.g., 110), and depositing dielectric 116 around the attached IC dies. At 606, layer i+2 (e.g., layer 104) is attached to layer i+1 (e.g., layer 102). In many embodiments, the operation may comprise attaching IC dies (e.g., 112) and depositing dielectric 116 around the attached IC dies. At 608, cavity 412 may be generated for attaching IC die 120 having interconnects 122 comprising solder. At 610, no-flow underfill 210 may be pre-attached on interface 124. At 612, IC die 120 having interconnects 122 comprising solder may be attached to interface 124 by TCB followed by solder reflow process, during which no-flow underfill 210 cures. At 614, layer i+2 (e.g., layer 104) may be planarized, for example, by CMP. At 616, a determination may be made whether the structure is complete. If not, the operations step to 618, at which the structure is assigned to layer i, and the operations may repeat from step 504 onwards. If the structure is complete at step 616, the operations may continue to 620, at which carrier substrate 402 may be debonded from the structure to expose a surface for plating bumps of DTPS interconnects 138. At step 622, the bumps of DTPS interconnects 138 may be plated, the structure diced into individual units of microelectronic assembly 100, and each unit may be attached to corresponding package substrate 108.

Figure 7:
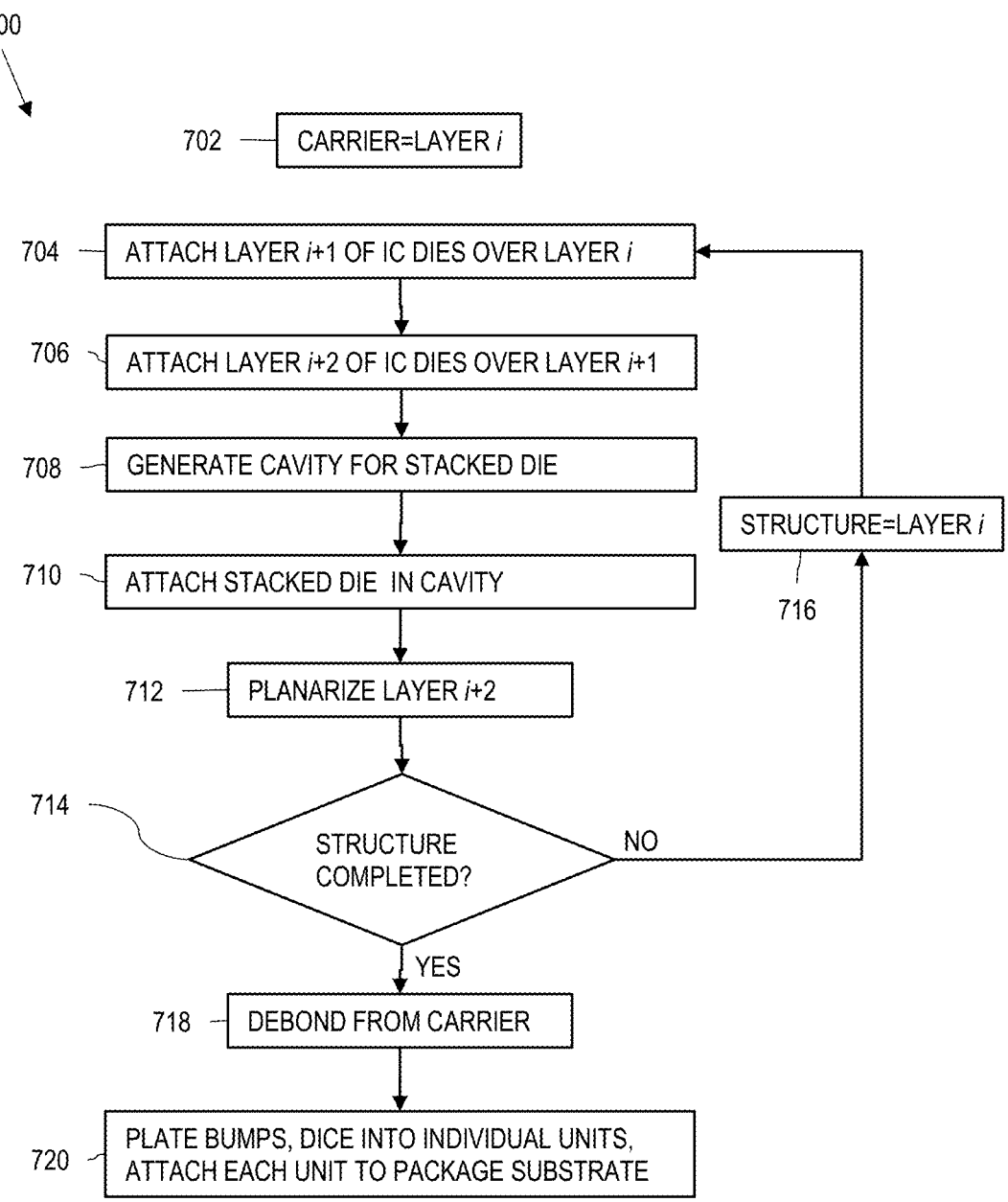
FIG. 7 is a simplified flow diagram illustrating example operations associated with manufacture of an example microelectronic assembly according to some embodiments of the present disclosure.

FIG. 7 is a simplified flow diagram illustrating example operations 700 that may be associated with manufacture of an example microelectronic assembly 100 according to various embodiments of the present disclosure. The operations start at 702, carrier substrate 402 being assigned to a layer i, i=0 for this first step. At 704, layer i+1 (e.g., layer 102) is attached to layer i (e.g., carrier substrate 402). In many embodiments, the operation may comprise attaching IC dies (e.g., 110), and depositing dielectric 116 around the attached IC dies. At 706, layer i+2 (e.g., layer 104) is attached to layer i+1 (e.g., layer 102). In many embodiments, the operation may comprise attaching IC dies (e.g., 112), and depositing dielectric 116 around the attached IC dies. At 708, cavity 412 may be generated for attaching IC die 120 comprising a stack of IC dies on interface 124. At 710, IC die 120 comprising a stack of IC dies may be attached to interface 124 by interconnects 122, for example, comprising hybrid bonds. At 712, layer i+2 (e.g., layer 104) may be planarized, for example, by CMP. At 714, a determination may be made whether the structure is complete. If not, the operations step to 716, at which the structure is assigned to layer i, and the operations may repeat from step 604 onwards. If the structure is complete at step 714, the operations may continue to 718, at which carrier substrate

402 may be debonded from the structure to expose a surface for plating bumps of DTPS interconnects 138. At step 720, the bumps of DTPS interconnects 138 may be plated, the structure diced into individual units of microelectronic assembly 100, and each unit may be attached to corresponding package substrate 108.

FIGS. 8A-8D are simplified cross-sectional illustrations of various operations associated with late assembly of microelectronic assembly 100. In some embodiments, certain components in the uppermost layer (e.g., farthest from package substrate 108) may not be assembled (e.g., incorporated into the assembly) concurrently with other components. Instead, microelectronic assembly 100 may be shipped (e.g., transported, dispatched, etc.) in an incomplete form, for example, to another factory, where the final components may be assembled in the package. Such a process is called "late assembly." As opposed to wafer or panel-level manufacturing processes, such late assembly processes are performed on individual packages separately. Typical examples of final components that are assembled in the late assembly process includes heat spreaders and passive elements, such as transformers, inductors, capacitors, and resistors. Note that the processes as described in FIGS. 8A-8D are performed at a package level, and not at wafer-level or panel-level assemblies. Thus, after the wafer-level processes as described in the preceding figures, the microelectronic assemblies are removed from the carrier (e.g., wafer or panel) to expose a package-side of the microelectronic assemblies, diced into individual units, and each unit is attached on the package-side to package substrate 108 with DTPS interconnects 138. Late assembly processes as described herein are performed on such individual packages.

Figure 8A:
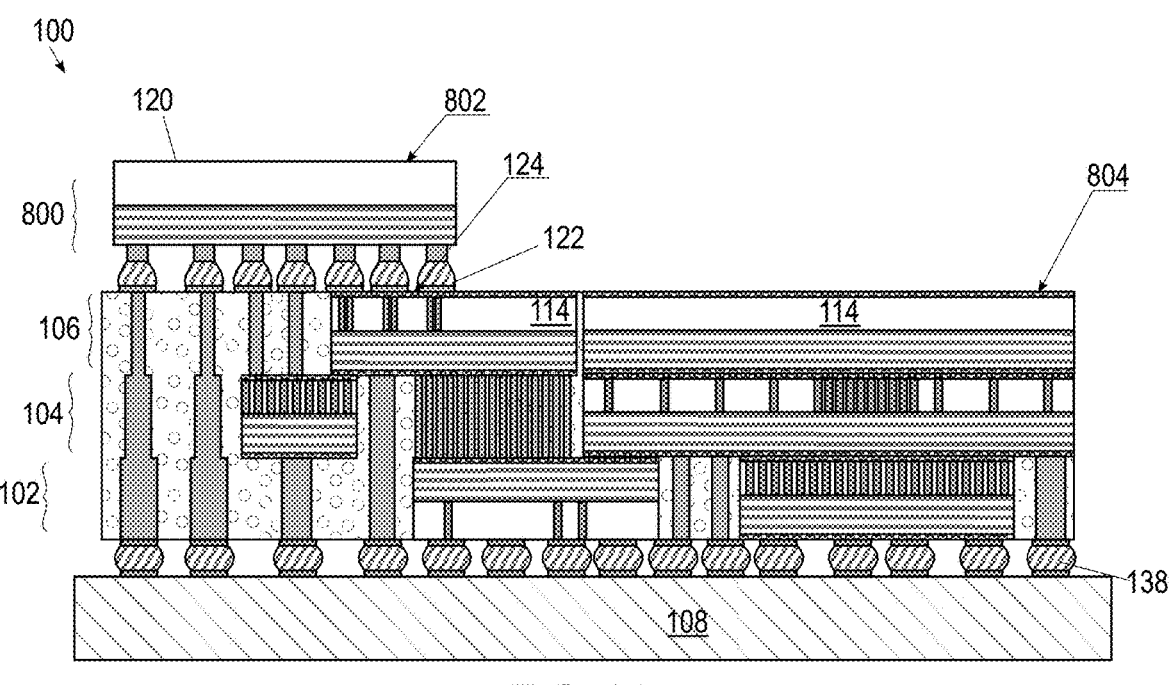
FIGS. 8A-8D are simplified cross-sectional view of various stages of manufacture of yet another microelectronic assembly according to some embodiments of the present disclosure.

FIG. 8A is a simplified cross-sectional illustration of microelectronic assembly 100 without dummy IC die 130 in uppermost layer 800. Note that dummy IC die 130 is merely used as an example to illustrate the late assembly process flow; any other component in the uppermost layer farthest from package substrate 108 may also be assembled as described herein. For example, in some embodiments, IC die 130 may be attached before the late assembly process, and IC die 120 may be attached during the late assembly process by solder reflow and other operations known in the art. Further, only a few elements in the figure are labeled so as not to clutter the drawing; elements not labeled are substantially the same as described in FIG. 1A. In the configuration as shown, a surface 802 of IC die 120 and a surface 804 of layer 106 adjacent and beneath uppermost layer 800 may be exposed without any components attached thereto. Surfaces 802 and 804 are on an opposite side to package substrate 108 in microelectronic assembly 100. Surfaces 802 and 804 are not coplanar and as such are susceptible to breakage and contamination if not handled suitably. Although only three layers are shown in microelectronic assembly 100, it may be understood that the process steps described herein are applicable to microelectronic assemblies with greater or fewer number of layers.

Figure 8B:
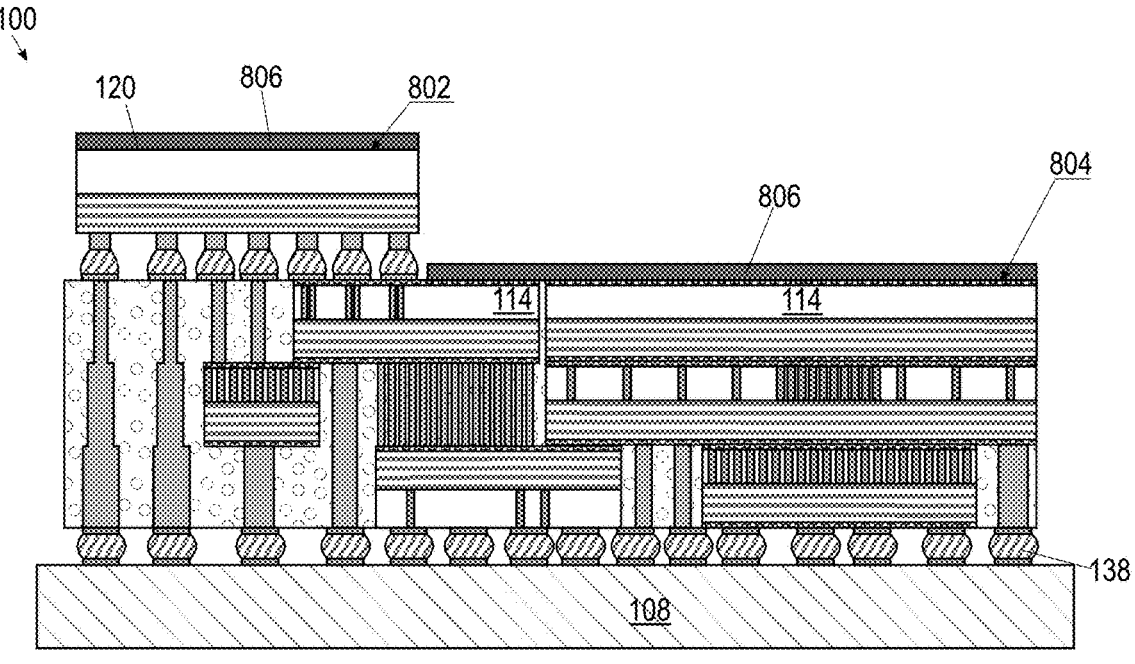

FIG. 8B is a simplified cross-sectional illustration of microelectronic assembly 100 subsequent to attaching a protective coating 806 over exposed surfaces 802 and 804. Protective coating 806 may comprise any suitable material known in the art that can removably adhere to surfaces 802 and 804. In some embodiments, protective coating 806 may be sprayed onto surfaces 802 and 804, and the material thus sprayed may solidify upon contact with the surface. In other embodiments, protective coating 806 may be pasted onto surfaces 802 and 804 for example, in the form of an adhesive film. In yet other embodiments, protective coating 806 may be dispensed in liquid form over surface 802 and 804 and then cured, for example, with ultraviolet light or heat.

Figure 8C:
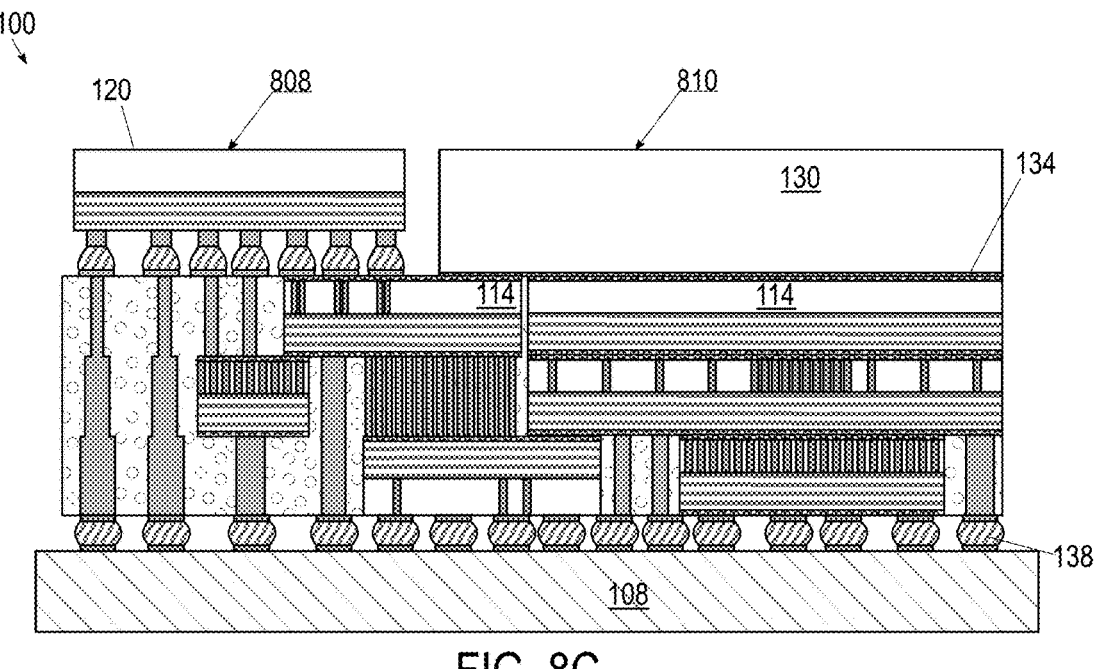

FIG. 8C is a simplified cross-sectional illustration of microelectronic assembly 100 subsequent to removing protective coating 806 and attaching IC die 130 on surface 804 with DTD interconnects 134. In embodiments in which IC die 130 is attached before the late assembly process, and IC die 120 is attached during the late assembly process, the attachment operations comprise solder reflow or other operations suitable to the nature of DTD interconnects 122. In some embodiments in which IC die 130 as assembled is taller than the other components in microelectronic assembly 100 so that it juts out, a planarizing process may be performed such that exposed surface 808 of IC die 120 and exposed surface 810 of IC die 130 are substantially coplanar. Such coplanar surfaces 808 and 810 are conducive to further assembly processes, for example, attaching other components thereto.

Figure 8D:
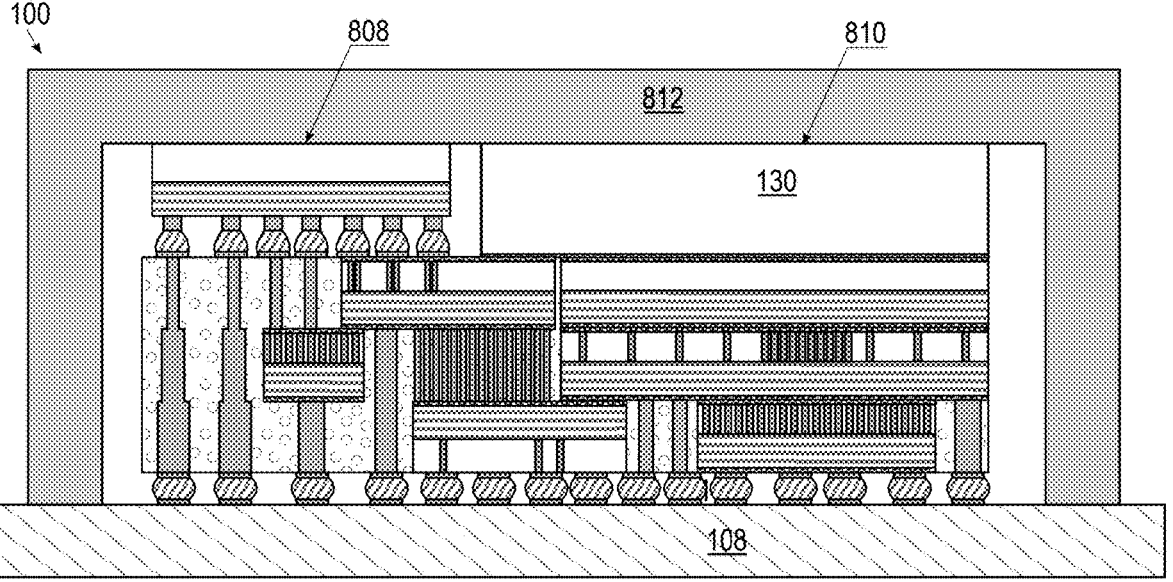

FIG. 8D is a simplified cross-sectional illustration of microelectronic assembly 100 subsequent to attaching a heat spreader 812 to surfaces 808 and 810 of microelectronic assembly 100. Heat spreader 812 may comprise any suitable thermally conductive material, such as copper, aluminum, graphite, etc. Note that the shape of heat spreader 812 is merely illustrative; other shapes are possible, for example, with fins, or plates, etc. without departing from the broad scope of the embodiments. Further, heat spreader 812 may be attached by any suitable process, such as with adhesive paste, brazing, etc. that facilitates heat conduction. In some embodiments, in which heat conduction is not of concern, heat spreader 812 may be substituted by a protective casing, which may be an insulator, like ceramic or plastic.

Although the operations illustrated in FIGS. 4A-8D are described once each and in a particular order, the operations may be performed in any suitable order and repeated as desired. For example, one or more operations may be performed in parallel to manufacture multiple IC packages substantially simultaneously. In another example, the operations may be performed in a different order to reflect the structure of a particular IC package in which one or more microelectronic assembly 100 as described herein may be included. Numerous variations also possible to achieve the desired structure of microelectronic assembly 100.

Furthermore, the operations illustrated in FIGS. 4A-8D may be combined or may include more details than described. Still further, the operations may further include other manufacturing operations related to fabrication of other components of the semiconductor assemblies described herein, or any devices that may include semiconductor assemblies as described herein. For example, the operations may include various cleaning operations, surface planarization operations (e.g., using CMP), operations for surface roughening, operations to include barrier and/or adhesion layers as desired, and/or operations for incorporating packages as described herein in, or with, an IC die, a computing device, or any desired structure or device.

Example Devices and Components

Figure 9:
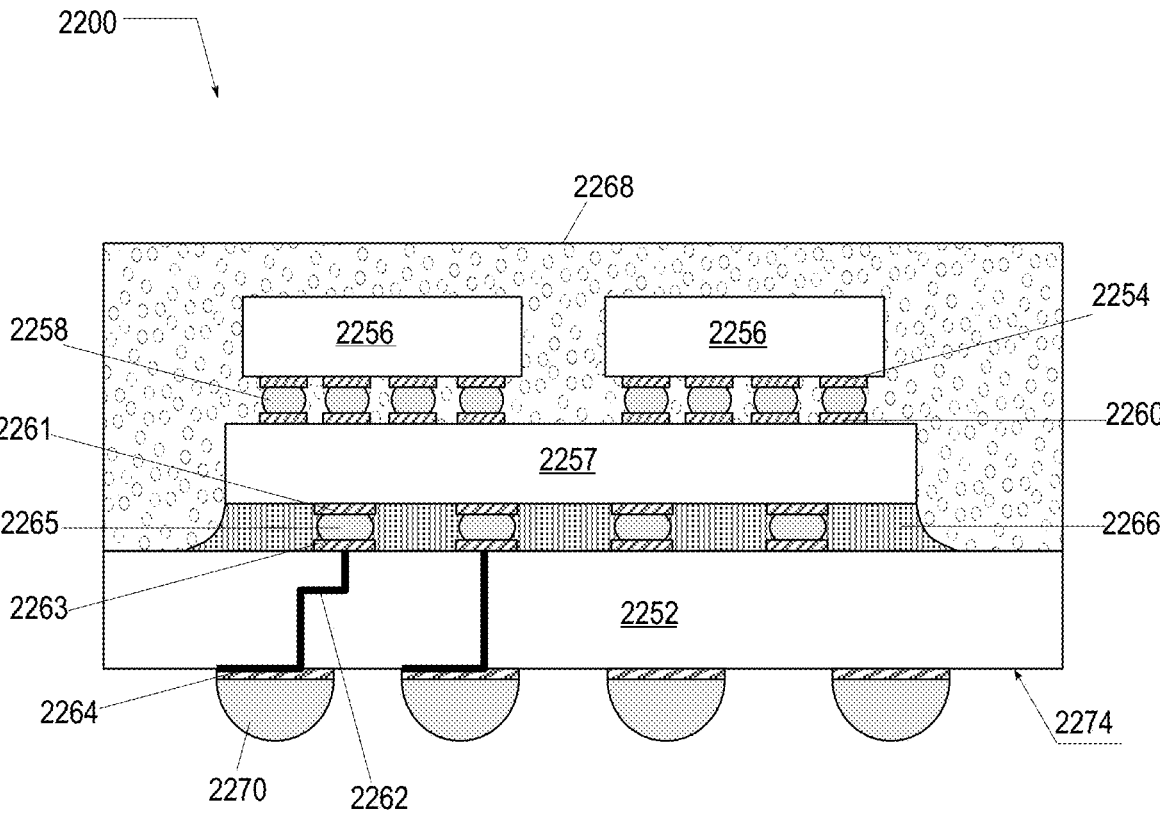
FIG. 9 is a cross-sectional view of a device package that includes one or more microelectronic assemblies in accordance with any of the embodiments disclosed herein.
Figure 11:
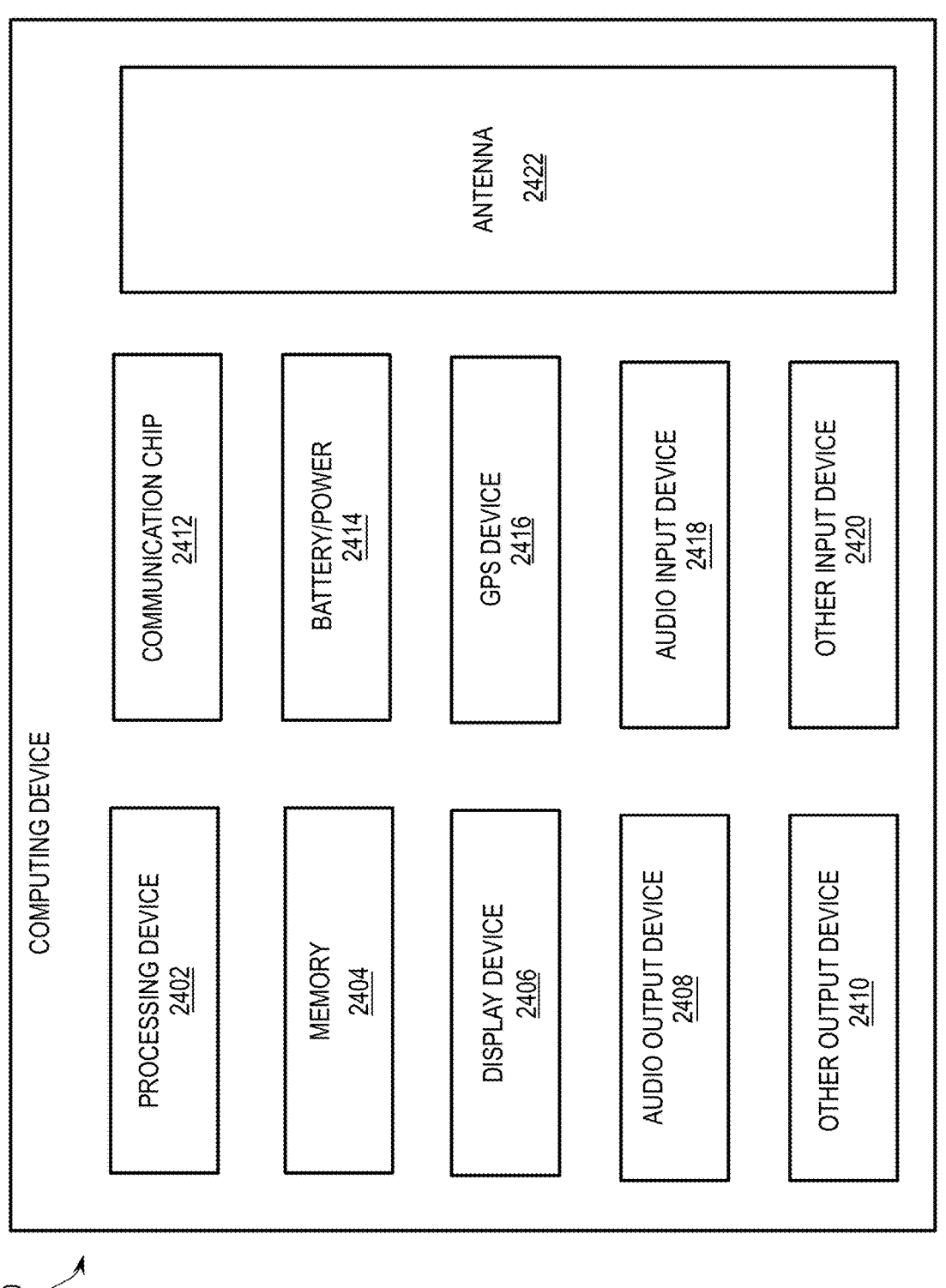
FIG. 11 is a block diagram of an example computing device that includes one or more microelectronic assemblies in accordance with any of the embodiments disclosed herein.

The packages disclosed herein, e.g., any of the embodiments shown in FIGS. 1A-3 or any further embodiments described herein, may be included in any suitable electronic component. FIGS. 9-11 illustrate various examples of packages, assemblies, and devices that may be used with or include any of the IC packages as disclosed herein.

FIG. 9 is a side, cross-sectional view of an example IC package 2200 that may include IC packages in accordance with any of the embodiments disclosed herein. In some embodiments, the IC package 2200 may be a system-in-package (SiP).

As shown in the figure, package substrate 2252 may be formed of an insulator (e.g., a ceramic, a buildup film, an epoxy film having filler particles therein, etc.), and may have conductive pathways extending through the insulator between first face 2272 and second face 2274, or between different locations on first face 2272, and/or between different locations on second face 2274. These conductive pathways may take the form of any of the interconnect structures comprising lines and/or vias.

Package substrate 2252 may include conductive contacts 2263 that are coupled to conductive pathway 2262 through package substrate 2252, allowing circuitry within dies 2256 and/or interposer 2257 to electrically couple to various ones of conductive contacts 2264 (or to other devices included in package substrate 2252, not shown).

IC package 2200 may include interposer 2257 coupled to package substrate 2252 via conductive contacts 2261 of interposer 2257, first-level interconnects 2265, and conductive contacts 2263 of package substrate 2252. First-level interconnects 2265 illustrated in the figure are solder bumps, but any suitable first-level interconnects 2265 may be used, such as solder bumps, solder posts, or bond wires.

IC package 2200 may include one or more dies 2256 coupled to interposer 2257 via conductive contacts 2254 of dies 2256, first-level interconnects 2258, and conductive contacts 2260 of interposer 2257. Conductive contacts 2260 may be coupled to conductive pathways (not shown) through interposer 2257, allowing circuitry within dies 2256 to electrically couple to various ones of conductive contacts 2261 (or to other devices included in interposer 2257, not shown). First-level interconnects 2258 illustrated in the figure are solder bumps, but any suitable first-level interconnects 2258 may be used, such as solder bumps, solder posts, or bond wires. As used herein, a "conductive contact" may refer to a portion of electrically conductive material (e.g., metal) serving as an interface between different components; conductive contacts may be recessed in, flush with, or extending away from a surface of a component, and may take any suitable form (e.g., a conductive pad or socket).

In some embodiments, underfill material 2266 may be disposed between package substrate 2252 and interposer 2257 around first-level interconnects 2265, and mold 2268 may be disposed around dies 2256 and interposer 2257 and in contact with package substrate 2252. In some embodiments, underfill material 2266 may be the same as mold 2268. Example materials that may be used for underfill material 2266 and mold 2268 are epoxies as suitable. Second-level interconnects 2270 may be coupled to conductive contacts 2264. Second-level interconnects 2270 illustrated in the figure are solder balls (e.g., for a ball grid array (BGA) arrangement), but any suitable second-level interconnects 2270 may be used (e.g., pins in a pin grid array arrangement or lands in a land grid array arrangement). Second-level interconnects 2270 may be used to couple IC package 2200 to another component, such as a circuit board (e.g., a motherboard), an interposer, or another IC package, as known in the art and as discussed below with reference to FIG. 10.

In various embodiments, any of dies 2256 may be microelectronic assembly 100 as described herein. In embodiments in which IC package 2200 includes multiple dies 2256, IC package 2200 may be referred to as a multi-chip package (MCP). Dies 2256 may include circuitry to perform any desired functionality. For example, besides one or more of dies 2256 being microelectronic assembly 100 as described herein, one or more of dies 2256 may be logic dies (e.g., silicon-based dies), one or more of dies 2256 may be memory dies (e.g., high-bandwidth memory), etc. In some embodiments, any of dies 2256 may be implemented as discussed with reference to any of the previous figures. In some embodiments, at least some of dies 2256 may not include implementations as described herein.

Although IC package 2200 illustrated in the figure is a flip-chip package, other package architectures may be used. For example, IC package 2200 may be a BGA package, such as an embedded wafer-level ball grid array (eWLB) package. In another example, IC package 2200 may be a wafer-level chip scale package (WLCSP) or a panel fan-out (FO) package. Although two dies 2256 are illustrated in IC package 2200, IC package 2200 may include any desired number of dies 2256. IC package 2200 may include additional passive components, such as surface-mount resistors, capacitors, and inductors disposed over first face 2272 or second face 2274 of package substrate 2252, or on either face of interposer 2257. More generally, IC package 2200 may include any other active or passive components known in the art.

In some embodiments, no interposer 2257 may be included in IC package 2200; instead, dies 2256 may be coupled directly to conductive contacts 2263 at first face 2272 by first-level interconnects 2265.

FIG. 10 is a cross-sectional side view of an IC device assembly 2300 that may include components having one or more microelectronic assembly 100 in accordance with any of the embodiments disclosed herein. IC device assembly 2300 includes a number of components disposed over a circuit board 2302 (which may be, e.g., a motherboard). IC device assembly 2300 includes components disposed over a first face 2340 of circuit board 2302 and an opposing second face 2342 of circuit board 2302; generally, components may be disposed over one or both faces 2340 and 2342. In particular, any suitable ones of the components of IC device assembly 2300 may include any of the one or more microelectronic assembly 100 in accordance with any of the embodiments disclosed herein; e.g., any of the IC packages discussed below with reference to IC device assembly 2300 may take the form of any of the embodiments of IC package 2200 discussed above with reference to FIG. 9.

In some embodiments, circuit board 2302 may be a PCB including multiple metal layers separated from one another by layers of insulator and interconnected by electrically conductive vias. Any one or more of the metal layers may be formed in a desired circuit pattern to route electrical signals (optionally in conjunction with other metal layers) between the components coupled to circuit board 2302. In other embodiments, circuit board 2302 may be a non-PCB package substrate.

As illustrated in the figure, in some embodiments, IC device assembly 2300 may include a package-on-interposer structure 2336 coupled to first face 2340 of circuit board 2302 by coupling components 2316. Coupling components 2316 may electrically and mechanically couple package-on-interposer structure 2336 to circuit board 2302, and may include solder balls (as shown), male and female portions of a socket, an adhesive, an underfill material, and/or any other suitable electrical and/or mechanical coupling structure.

Package-on-interposer structure 2336 may include IC package 2320 coupled to interposer 2304 by coupling components 2318. Coupling components 2318 may take any suitable form depending on desired functionalities, such as the forms discussed above with reference to coupling components 2316. In some embodiments, IC package 2320 may be or include IC package 2200, e.g., as described above with reference to FIG. 9. In some embodiments, IC package 2320 may include at least one microelectronic assembly 100 as described herein. Microelectronic assembly 100 is not specifically shown in the figure in order to not clutter the drawing.

Although a single IC package 2320 is shown in the figure, multiple IC packages may be coupled to interposer 2304; indeed, additional interposers may be coupled to interposer 2304. Interposer 2304 may provide an intervening package substrate used to bridge circuit board 2302 and IC package 2320. Generally, interposer 2304 may redistribute a connection to a wider pitch or reroute a connection to a different connection. For example, interposer 2304 may couple IC package 2320 to a BGA of coupling components 2316 for coupling to circuit board 2302.

In the embodiment illustrated in the figure, IC package 2320 and circuit board 2302 are attached to opposing sides of interposer 2304. In other embodiments, IC package 2320 and circuit board 2302 may be attached to a same side of interposer 2304. In some embodiments, three or more components may be interconnected by way of interposer 2304.

Interposer 2304 may be formed of an epoxy resin, a fiberglass-reinforced epoxy resin, a ceramic material, or a polymer material such as polyimide. In some implementations, interposer 2304 may be formed of alternate rigid or flexible materials that may include the same materials described above for use in a semiconductor substrate, such as silicon, germanium, and other group III-V and group IV materials. Interposer 2304 may include metal interconnects 2308 and vias 2310, including but not limited to TSVs 2306. Interposer 2304 may further include embedded devices 2314, including both passive and active devices. Such devices may include, but are not limited to, capacitors, decoupling capacitors, resistors, inductors, fuses, diodes, transformers, sensors, electrostatic discharge (ESD) devices, and memory devices. More complex devices such as radio frequency (RF) devices, power amplifiers, power management devices, antennas, arrays, sensors, and microelectromechanical systems (MEMS) devices may also be formed on interposer 2304. Package-on-interposer structure 2336 may take the form of any of the package-on-interposer structures known in the art.

In some embodiments, IC device assembly 2300 may include an IC package 2324 coupled to first face 2340 of circuit board 2302 by coupling components 2322. Coupling components 2322 may take the form of any of the embodiments discussed above with reference to coupling components 2316, and IC package 2324 may take the form of any of the embodiments discussed above with reference to IC package 2320.

In some embodiments, IC device assembly 2300 may include a package-on-package structure 2334 coupled to second face 2342 of circuit board 2302 by coupling components 2328. Package-on-package structure 2334 may include an IC package 2326 and an IC package 2332 coupled together by coupling components 2330 such that IC package 2326 is disposed between circuit board 2302 and IC package 2332. Coupling components 2328 and 2330 may take the form of any of the embodiments of coupling components 2316 discussed above, and IC packages 2326 and/or 2332 may take the form of any of the embodiments of IC package 2320 discussed above. Package-on-package structure 2334 may be configured in accordance with any of the package-on-package structures known in the art.

FIG. 11 is a block diagram of an example computing device 2400 that may include one or more components having one or more IC packages in accordance with any of the embodiments disclosed herein. For example, any suitable ones of the components of computing device 2400 may include a microelectronic assembly (e.g., 100) in accordance with any of the embodiments disclosed herein. In another example, any one or more of the components of computing device 2400 may include any embodiments of IC package 2200 (e.g., as shown in FIG. 9). In yet another example, any one or more of the components of computing device 2400 may include an IC device assembly 2300 (e.g., as shown in FIG. 10).

A number of components are illustrated in the figure as included in computing device 2400, but any one or more of these components may be omitted or duplicated, as suitable for the application. In some embodiments, some or all of the components included in computing device 2400 may be attached to one or more motherboards. In some embodiments, some or all of these components are fabricated onto a single SOC die.

Additionally, in various embodiments, computing device 2400 may not include one or more of the components illustrated in the figure, but computing device 2400 may include interface circuitry for coupling to the one or more components. For example, computing device 2400 may not include a display device 2406, but may include display device interface circuitry (e.g., a connector and driver circuitry) to which display device 2406 may be coupled. In another set of examples, computing device 2400 may not include an audio input device 2418 or an audio output device 2408, but may include audio input or output device interface circuitry (e.g., connectors and supporting circuitry) to which audio input device 2418 or audio output device 2408 may be coupled.

Computing device 2400 may include a processing device 2402 (e.g., one or more processing devices). As used herein, the term "processing device" or "processor" may refer to any device or portion of a device that processes electronic data from registers and/or memory to transform that electronic data into other electronic data that may be stored in registers and/or memory. Processing device 2402 may include one or more DSPs, ASICs, CPUs, GPUs, cryptoprocessors (specialized processors that execute cryptographic algorithms within hardware), server processors, or any other suitable processing devices. Computing device 2400 may include a memory 2404, which may itself include one or more memory devices such as volatile memory (e.g., dynamic random access memory (DRAM)), nonvolatile memory (e.g., read-only memory (ROM)), flash memory, solid state memory, and/or a hard drive. In some embodiments, memory 2404 may include memory that shares a die with processing device 2402. This memory may be used as cache memory and may include embedded dynamic random access memory (eDRAM) or spin transfer torque magnetic random access memory (STT-M RAM).

In some embodiments, computing device 2400 may include a communication chip 2412 (e.g., one or more communication chips). For example, communication chip 2412 may be configured for managing wireless communications for the transfer of data to and from computing device 2400. The term "wireless" and its derivatives may be used to describe circuits, devices, systems, methods, techniques, communications channels, etc., that may communicate data through the use of modulated electromagnetic radiation through a nonsolid medium. The term does not imply that the associated devices do not contain any wires, although in some embodiments they might not.

Communication chip 2412 may implement any of a number of wireless standards or protocols, including but not limited to Institute for Electrical and Electronic Engineers (IEEE) standards including Wi-Fi (IEEE 802.11 family), IEEE 802.16 standards (e.g., IEEE 802.16-2005 Amendment), Long-Term Evolution (LTE) project along with any amendments, updates, and/or revisions (e.g., advanced LTE project, ultramobile broadband (UMB) project (also referred to as "3GPP2"), etc.). IEEE 802.16 compatible Broadband Wireless Access (BWA) networks are generally referred to as WiMAX networks, an acronym that stands for Worldwide Interoperability for Microwave Access, which is a certification mark for products that pass conformity and interoperability tests for the IEEE 802.16 standards. The communication chip 2412 may operate in accordance with a Global System for Mobile Communication (GSM), General Packet Radio Service (GPRS), Universal Mobile Telecommunications System (UMTS), High-Speed Packet Access (HSPA), Evolved HSPA (E-HSPA), or LTE network. The communication chip 2412 may operate in accordance with Enhanced Data for GSM Evolution (EDGE), GSM EDGE Radio Access Network (GERAN), Universal Terrestrial Radio Access Network (UTRAN), or Evolved UTRAN (E-UTRAN). Communication chip 2412 may operate in accordance with Code Division Multiple Access (CDMA), Time Division Multiple Access (TDMA), Digital Enhanced Cordless Telecommunications (DECT), Evolution-Data Optimized (EV-DO), and derivatives thereof, as well as any other wireless protocols that are designated as 3G, 4G, 5G, and beyond. Communication chip 2412 may operate in accordance with other wireless protocols in other embodiments. Computing device 2400 may include an antenna 2422 to facilitate wireless communications and/or to receive other wireless communications (such as AM or FM radio transmissions).

In some embodiments, communication chip 2412 may manage wired communications, such as electrical, optical, or any other suitable communication protocols (e.g., the Ethernet). As noted above, communication chip 2412 may include multiple communication chips. For instance, a first communication chip 2412 may be dedicated to shorter-range wireless communications such as Wi-Fi or Bluetooth, and a second communication chip 2412 may be dedicated to longer-range wireless communications such as global positioning system (GPS), EDGE, GPRS, CDMA, WiMAX, LTE, EV-DO, or others. In some embodiments, a first communication chip 2412 may be dedicated to wireless communications, and a second communication chip 2412 may be dedicated to wired communications.

Computing device 2400 may include battery/power circuitry 2414. Battery/power circuitry 2414 may include one or more energy storage devices (e.g., batteries or capacitors) and/or circuitry for coupling components of computing device 2400 to an energy source separate from computing device 2400 (e.g., AC line power).

Computing device 2400 may include a display device 2406 (or corresponding interface circuitry, as discussed above). Display device 2406 may include any visual indicators, such as a heads-up display, a computer monitor, a projector, a touchscreen display, a liquid crystal display (LCD), a light-emitting diode display, or a flat panel display, for example.

Computing device 2400 may include audio output device 2408 (or corresponding interface circuitry, as discussed above). Audio output device 2408 may include any device that generates an audible indicator, such as speakers, headsets, or earbuds, for example.

Computing device 2400 may include audio input device 2418 (or corresponding interface circuitry, as discussed above). Audio input device 2418 may include any device that generates a signal representative of a sound, such as microphones, microphone arrays, or digital instruments (e.g., instruments having a musical instrument digital interface (MIDI) output).

Computing device 2400 may include a GPS device 2416 (or corresponding interface circuitry, as discussed above). GPS device 2416 may be in communication with a satellite-based system and may receive a location of computing device 2400, as known in the art.

Computing device 2400 may include other output device 2410 (or corresponding interface circuitry, as discussed above). Examples of other output device 2410 may include an audio codec, a video codec, a printer, a wired or wireless transmitter for providing information to other devices, or an additional storage device.

Computing device 2400 may include other input device 2420 (or corresponding interface circuitry, as discussed above). Examples of other input device 2420 may include an accelerometer, a gyroscope, a compass, an image capture device, a keyboard, a cursor control device such as a mouse, a stylus, a touchpad, a bar code reader, a Quick Response (QR) code reader, any sensor, or a radio frequency identification (RFID) reader.

Computing device 2400 may have any desired form factor, such as a handheld or mobile computing device (e.g., a cell phone, a smart phone, a mobile internet device, a music player, a tablet computer, a laptop computer, a netbook computer, an ultrabook computer, a personal digital assistant (PDA), an ultramobile personal computer, etc.), a desktop computing device, a server or other networked computing component, a printer, a scanner, a monitor, a set-top box, an entertainment control unit, a vehicle control unit, a digital camera, a digital video recorder, or a wearable computing device. In some embodiments, computing device 2400 may be any other electronic device that processes data.

Select Examples

The following paragraphs provide various examples of the embodiments disclosed herein.

Example 1 provides a microelectronic assembly comprising (e.g., FIG. 1): a first IC die (e.g., 120); a second IC die (e.g., 114); and a third IC die (e.g., 112), in which: the first IC die is coupled to the second IC die with first interconnects (e.g., 122) having a first pitch, the second IC die is coupled to the third IC die with second interconnects (e.g., 115) having a second pitch, the first pitch is greater than the second pitch, and the second pitch is less than 10 micrometers.

Example 2 provides the microelectronic assembly of example 1, in which the first pitch is between 20 micrometers and 80 micrometers.

Example 3 provides the microelectronic assembly of example 1, in which the first pitch is between 80 micrometers and 150 micrometers.

Example 4 provides the microelectronic assembly of example 1, in which the second pitch is less than 1 micrometer.

Example 5 provides the microelectronic assembly of any of examples 1-4, in which (e.g., FIG. 2, 3): the first IC die (e.g., 120) and the second IC die (e.g., 206) are attached to a surface of a first layer (e.g., 106) that includes IC dies, the first IC die and the second IC die are in a second layer (e.g., 202), and the microelectronic assembly further comprises a third layer (e.g., 204) of IC dies (e.g., 208) over the second layer.

Example 6 provides the microelectronic assembly of example 5, in which at least one IC die (e.g., 206) in the second layer is coupled to the third layer with interconnects of the second pitch.

Example 7 provides the microelectronic assembly of example 5, in which the first layer, the second layer and the third layer further comprise a dielectric (e.g., 116) laterally surrounding the IC dies, including the first IC die and the second IC die.

Example 8 provides the microelectronic assembly of example 7, in which the dielectric comprises a compound of silicon and at least one of oxygen, carbon, and nitrogen.

Example 9 provides the microelectronic assembly of any of examples 7-8, further comprising TDVs (e.g., 118) in the dielectric.

Example 10 provides the microelectronic assembly of any of examples 5-9, in which: the first layer is over a carrier substrate (e.g., 402), and the carrier substrate is at least one of a wafer and a panel.

Example 11 provides the microelectronic assembly of any of examples 1-10, in which: the first interconnects comprise solder, and the microelectronic assembly further comprises underfill (e.g., 210) around the first interconnects.

Example 12 provides the microelectronic assembly of any of examples 1-11, in which (e.g., FIG. 5E): the first IC die and the second IC die are attached to a surface of a carrier substrate, and the carrier substrate is at least one of a wafer and a panel.

Example 13 provides an IC package comprising: a first plurality of IC dies (e.g., 114) in a first layer (e.g., 106); a first IC die (e.g., 206) in a second layer (e.g., 202), the first IC die coupled to a surface of the first layer with first interconnects (e.g., 115) having a first pitch; and a second IC die (e.g., 120) in the second layer, the second IC die coupled to the surface of the first layer with second interconnects (e.g., 122) having a second pitch, in which: the second pitch is greater than the first pitch, and the first pitch is less than 10 micrometers.

Example 14 provides the IC package of example 13, in which the first interconnects are hybrid bonds.

Example 15 provides the IC package of example 13, in which: the second interconnects are micro-bumps with solder caps, a cross-sectional dimension of any one of the micro-bumps is between 10 micrometers and 40 micrometers, and the second pitch is between 20 micrometers and 80 micrometers.

Example 16 provides the IC package of example 13, in which: the second interconnects are copper pillars and solder, a cross-sectional dimension of any one of the copper pillars is between 40 micrometers and 75 micrometers, and the second pitch is between 80 micrometers and 150 micrometers.

Example 17 provides the IC package of any of examples 13-16, in which the first IC die is a dummy IC die (e.g., 130) having no electrical functionalities.

Example 18 provides the IC package of any of examples 13-17, in which: a first surface of the first IC die and a second surface of the second IC die are coplanar, and the first surface and the second surface are opposite to the first layer.

Example 19 provides the IC package of example 18, in which the first IC die is a stack of IC dies coupled to each other with interconnects having the first pitch.

Example 20 provides the IC package of any of examples 13-19, in which the first layer is coupled to a package substrate (e.g., 108).

Example 21 provides a method comprising (e.g., FIG. 6): attaching a first IC die to a first surface of a first layer with first interconnects having a first pitch, in which the first layer comprises IC dies in a dielectric (e.g., 606); depositing the dielectric around the first IC die to form a second layer (e.g., 606); forming a cavity in the dielectric to expose a portion of the first surface of the first layer (e.g., 608); dispensing no-flow underfill in the cavity (e.g., 610); coupling a second IC die to the exposed portion of the first surface of the first layer with second interconnects having a second pitch larger than the first pitch (e.g., 612); and planarizing a second surface of the second layer opposite to the first surface (e.g., 614).

Example 22 provides the method of example 21, further comprising attaching the first layer to a carrier substrate (e.g., 602).

Example 23 provides the method of example 22, in which the carrier substrate is one of a panel and a wafer.

Example 24 provides the method of example 22, in which the attaching comprises: attaching the IC dies of the first layer to the carrier substrate with an adhesive; and depositing the dielectric around the IC dies to form the first layer.

Example 25 provides the method of any of examples 21-24, in which the dielectric comprises a compound of silicon and at least one of oxygen, carbon, and nitrogen, and depositing the dielectric comprises physical vapor deposition.

Example 26 provides the method of any of examples 21-25, in which dispensing no-flow underfill comprises: depositing a film comprising the no-flow underfill; and etching the film to expose conductive contact pads for coupling to the second IC die.

Example 27 provides the method of any of examples 21-26, in which coupling the second IC die comprises a TCB process, followed by a solder reflow process.

Example 28 provides the method of any of examples 21-27, in which planarizing the second surface comprises CMP.

Example 29 provides the method of any of examples 21-28, further comprising attaching a third layer to the planarized second surface with a plurality of interconnects having the first pitch.

Example 30 provides the method of example 29, further comprising repeating: depositing the dielectric, forming the cavity, coupling the second IC die and planarizing the second surface to generate a multi-layered microelectronic assembly, in which: first solder interconnects in any one layer in the microelectronic assembly are formed before second solder interconnects in another layer in the microelectronic assembly, and the first solder interconnects melt at a higher temperature than the second solder interconnects.

Example 31 provides the method of example 30, further comprising: dicing the multi-layered microelectronic assembly into individual units; attaching a first side of one of the individual units to a package substrate; attaching a protective coating (e.g., 806) over an exposed surface (e.g., 802, 804) of a second side of the unit opposite to the first side; transporting the unit; removing the protective coating; and attaching a component (e.g., 130) to the exposed surface of the second side.

Example 32 provides the method of example 31, further comprising attaching a heat spreader on the component subsequent to attaching the component to the exposed surface.

Example 33 provides a microelectronic assembly comprising: a first stack coupled to a surface, the first stack comprising a first number of IC dies; and a second stack coupled to the surface, the second stack comprising a second number of IC dies, in which: the first stack and the second stack are laterally surrounded by a dielectric, the first stack and the second stack have a same thickness, and the first number is less than the second number.

Example 34 provides the microelectronic assembly of example 33, in which the thickness is between 60 micrometers and 100 micrometers.

Example 35 provides the microelectronic assembly of any of examples 33-34, in which the IC dies in the first stack and the second stack are coupled with interconnects having pitch of less than 10 micrometers.

Example 36 provides the microelectronic assembly of any of examples 33-35, in which: the first stack and the second stack are in a first layer, the microelectronic assembly comprises a second layer over the first layer, and the second layer comprises one or more IC dies.

Example 37 provides the microelectronic assembly of any of examples 33-36, further comprising other stacks of IC dies coupled to the surface, the other stacks of IC dies having varying numbers of IC dies, and the same thickness as the first stack and the second stack.

Example 38 provides the microelectronic assembly of any of examples 33-37, in which the dielectric comprises a compound of silicon and at least one of oxygen, carbon, and nitrogen.

Example 39 provides the microelectronic assembly of any of examples 33-38, in which: the surface is of a carrier substrate, and the carrier substrate is one of a panel and a wafer.

Example 40 provides the microelectronic assembly of any of examples 33-39, in which the surface is of a layer comprising IC dies surrounded by dielectric.

Example 41 provides an IC package comprising: a package substrate (e.g., 108); and a layer coupled to the package substrate, in which: the layer has a thickness and comprises a plurality of IC dies, the plurality of IC dies comprises a first stack of IC dies and a laterally adjacent second stack of IC dies, and the first stack has fewer number of IC dies than the second stack.

Example 42 provides the IC package of example 41, in which the layer comprises a dielectric surrounding the plurality of IC dies.

Example 43 provides the IC package of example 42, in which the dielectric comprises a compound of silicon and at least one of oxygen, carbon, and nitrogen.

Example 44 provides the IC package of any of examples 41-42, in which: the layer comprises a first layer, the plurality of IC dies comprises a first plurality of IC dies, and the IC package further comprises a second layer including a second plurality of IC dies adjacent to the first layer.

Example 45 provides the IC package of any of examples 41-44, in which the IC dies in the first stack and the second stack are coupled to each other with interconnects having pitch less than 10 micrometers.

Example 46 provides the IC package of any of examples 41-45, in which individual IC dies in the second stack are thinner than individual IC dies in the first stack.

Example 47 provides a method comprising (e.g., FIG. 7): attaching a first layer comprising IC dies in a dielectric on a carrier substrate (e.g., 704); attaching a second layer comprising IC dies over the layer (e.g., 706); forming a cavity through the dielectric to a first surface of the carrier substrate (e.g., 708); attaching an IC die stack to the first surface in the cavity, in which the IC die stack comprises a plurality of IC dies stacked one on top of another and coupled with hybrid bonds (e.g., 710); and planarizing a second surface of the IC die stack and the dielectric (e.g., 712).

Example 48 provides the method of example 47, further comprising attaching one or more additional layers comprising IC dies in the dielectric over the planarized second surface by hybrid bonds.

Example 49 provides the method of any of examples 47-48, in which the dielectric comprises a compound of silicon and at least one of oxygen, carbon, and nitrogen.

Example 50 provides the method of any of examples 47-49, in which the IC die stack is as thick as a combination of the first layer and the second layer after planarizing.

Example 51 provides the method of any of examples 47-50, in which forming the cavity comprises etching through the dielectric.

Example 52 provides the method of any of examples 47-51, in which the planarizing comprises CMP.

Example 53 provides the method of any of examples 47-52, in which attaching the first layer comprises: attaching the IC dies in the first layer on the carrier substrate; and depositing a dielectric around the IC dies.

Example 54 provides the method of any of examples 47-53, in which attaching the second layer comprises: coupling the IC dies of the second layer to the layer by hybrid bonds; and depositing the dielectric around the IC dies of the second layer.

The above description of illustrated implementations of the disclosure, including what is described in the abstract, is not intended to be exhaustive or to limit the disclosure to the precise forms disclosed. While specific implementations of, and examples for, the disclosure are described herein for illustrative purposes, various equivalent modifications are possible within the scope of the disclosure, as those skilled in the relevant art will recognize.

The invention claimed is:

1. A microelectronic assembly comprising:
a first integrated circuit (IC) die;
a second IC die; and
a third IC die,
wherein:
the first IC die is coupled to the second IC die with first interconnects having a first pitch,
the second IC die is coupled to the third IC die with second interconnects having a second pitch,
the first pitch is greater than the second pitch, and
the second pitch is less than 10 micrometers.

2. The microelectronic assembly of claim 1, wherein the first pitch is between 20 micrometers and 80 micrometers.

3. The microelectronic assembly of claim 1, wherein the first pitch is between 80 micrometers and 150 micrometers.

4. The microelectronic assembly of claim 1, wherein the second pitch is less than 1 micrometer.

5. The microelectronic assembly of claim 1, wherein:
the first IC die and the second IC die are attached to a surface of a first layer that includes IC dies,
the first IC die and the second IC die are in a second layer, and
the microelectronic assembly further comprises a third layer of IC dies over the second layer.

6. The microelectronic assembly of claim 5, wherein at least one IC die in the second layer is coupled to the third layer with interconnects of the second pitch.

7. The microelectronic assembly of claim 1, wherein:
the first interconnects comprise solder, and the microelectronic assembly further comprises underfill around the first interconnects.

8. An IC package comprising:

a first plurality of IC dies in a first layer;

a first IC die in a second layer, the first IC die coupled to a surface of the first layer with first interconnects having a first pitch; and a second IC die in the second layer, the second IC die coupled to the surface of the first layer with second interconnects having a second pitch, wherein:

the second pitch is greater than the first pitch, and the first pitch is less than 10 micrometers.

9. The IC package of claim 8, wherein the first interconnects are hybrid bonds.

10. The IC package of claim 8, wherein:

the second interconnects are micro-bumps with solder caps, a cross-sectional dimension of any one of the micro-bumps is between 10 micrometers and 40 micrometers, and the second pitch is between 20 micrometers and 80 micrometers.

11. The IC package of claim 8, wherein:

the second interconnects are copper pillars and solder, a cross-sectional dimension of any one of the copper pillars is between 40 micrometers and 75 micrometers, and the second pitch is between 80 micrometers and 150 micrometers.

12. The IC package of claim 8, wherein the first IC die is a dummy IC die having no electrical functionalities.

13. The IC package of claim 8, wherein the first IC die is a stack of IC dies coupled to each other with interconnects having the first pitch.

14. The IC package of claim 8, wherein the first layer is coupled to a package substrate.

* * * * *